(12) United States Patent
Do et al.

(10) Patent No.: US 9,112,112 B2
(45) Date of Patent: Aug. 18, 2015

(54) SUBMINIATURE LED ELEMENT AND MANUFACTURING METHOD THEREOF

(75) Inventors: Young-Rag Do, Seoul (KR); Yeon-Goog Sung, Goyang-si (KR)

(73) Assignee: PSI CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/114,317

(22) PCT Filed: Apr. 27, 2012

(86) PCT No.: PCT/KR2012/003309
§ 371 (c)(1),
(2), (4) Date: Jan. 22, 2014

(87) PCT Pub. No.: WO2012/148228
PCT Pub. Date: Nov. 1, 2012

(65) Prior Publication Data
US 2014/0145237 A1    May 29, 2014

(30) Foreign Application Priority Data
Apr. 28, 2011    (KR) .................. 10-2011-0040174

(51) Int. Cl.
*H01L 33/00* (2010.01)
*H01L 33/36* (2010.01)
(Continued)

(52) U.S. Cl.
CPC ............ *H01L 33/36* (2013.01); *H01L 33/0095* (2013.01); *H01L 33/08* (2013.01);
(Continued)

(58) Field of Classification Search
CPC ............................... H01L 33/44; H01L 33/52
USPC .................................. 257/79, 88; 438/29, 33
See application file for complete search history.

(56) References Cited

U.S. PATENT DOCUMENTS

| 7,591,699 B2 | 9/2009 | Morii |
| 7,727,788 B2 | 6/2010 | Han et al. |

(Continued)

FOREIGN PATENT DOCUMENTS

| JP | 2005-267991 A | 9/2005 |
| KR | 2006-0027791 A | 3/2006 |

(Continued)

OTHER PUBLICATIONS

English Translation of the International Preliminary Report on Patentability for PCT/KR2012/003309, IB, Geneva, issued Oct. 29, 2013, incorporating the English translation of the Written Opinion of the ISA, ISA/KR, mailed Sep. 27, 2012.

*Primary Examiner* — David Vu
*Assistant Examiner* — Brandon Fox
(74) *Attorney, Agent, or Firm* — Harness, Dickey & Pierce, P.L.C.

(57) ABSTRACT

Disclosed is a subminiature LED element and a manufacturing method thereof. The subminiature LED element includes a first conductive semiconductor layer, an active layer formed on the first conductive semiconductor layer, and a semiconductor light emission element of a micrometer or nanometer size including a second conductive semiconductor layer formed on the active layer, wherein the outer circumference of the semiconductor light emission element is coated with an insulation film. The manufacturing method includes 1) forming a first conductive semiconductor layer, an active layer and a second conductive semiconductor layer in order on a substrate, 2) etching the first conductive semiconductor layer, the active layer and the second conductive semiconductor layer so that the LED element has a diameter of a nanometer or micrometer level, and 3) forming an insulation film on the outer circumference of the first conductive semiconductor layer, the active layer and the second conductive semiconductor layer and removing the substrate. Therefore, a subminiature LED element of a nanometer or micrometer size may be effectively produced by combining a top-down manner and a bottom-up manner, and light emission efficiency may be improved by preventing a surface defect of the produced subminiature LED element.

13 Claims, 22 Drawing Sheets

(51) Int. Cl.
 *H01L 33/44* (2010.01)
 *H01L 33/18* (2010.01)
 *H01L 33/08* (2010.01)
 *H01L 33/52* (2010.01)
 *H01L 33/06* (2010.01)
 *H01L 33/20* (2010.01)

(52) U.S. Cl.
 CPC ............... *H01L 33/18* (2013.01); *H01L 33/44* (2013.01); *H01L 33/0079* (2013.01); *H01L 33/06* (2013.01); *H01L 33/20* (2013.01); *H01L 33/52* (2013.01)

(56) References Cited

U.S. PATENT DOCUMENTS

| | | | |
|---|---|---|---|
| 7,759,145 B2 | 7/2010 | Fujii | |
| 8,470,618 B2 | 6/2013 | Massies et al. | |
| 2006/0008943 A1* | 1/2006 | Hahn | 438/107 |
| 2009/0137075 A1* | 5/2009 | Yang et al. | 438/29 |
| 2011/0089850 A1 | 4/2011 | Shibata et al. | |
| 2011/0299044 A1* | 12/2011 | Yeh et al. | 353/52 |

FOREIGN PATENT DOCUMENTS

| | | |
|---|---|---|
| KR | 2006-0083119 A | 7/2006 |
| KR | 2011-0040676 A | 4/2011 |

* cited by examiner

SUBMINIATURE LED ELEMENT AND MANUFACTURING METHOD THEREOF

CROSS-REFERENCE TO RELATED APPLICATIONS

This application is a National Phase Entry of International Application No. PCT/KR2012/003309, filed on Apr. 27, 2012, which claims priority to Korean Patent Application Serial No. 10-2011-0040174, filed on Apr. 28, 2011, both of which are incorporated by reference herein.

TECHNICAL FIELD

The present disclosure relates to a subminiature LED element and a manufacturing method thereof, and more particularly, to a subminiature LED element capable of effectively producing a subminiature LED element of a nanometer or micrometer size by combining a top-down manner and a bottom-up manner, and improving light emission efficiency by preventing a surface defect of the produced subminiature LED element and a manufacturing method thereof.

BACKGROUND

At the present, there are active endeavors for developing a light emitting diode (LED) with high photoconversion efficiency by improving a nitride-based semiconductor growth structure or a grown film manufacturing process by using a nitride-based semiconductor with a great band gap. However, an LED TV known in the art until now adopts a white or three-color LED element as a backlight instead of a cold cathode fluorescent lamp (CCFL) backlight used in an existing LCD TV, and this is actually an LCD TV using an LED backlight. In detail, an outdoor electronic display board having several ten thousands or several hundred thousands of three-color (red, green and blue) LED lamps inserted into an ultra-large substrate is known as a full-color LED display available at the present, which is substantially a unique available product encountered everyday life. Therefore, in an accurate conception, an LED full-color display is not yet implemented at the present as a home TV or a computer monitor.

A display having a size of a TV or monitor has not been developed using an existing LED element due to the limits in a display manufacturing technique using an LED element and a full-color implementation technique. In an existing LED element manufacturing method, a p-semiconductor layer, a quantum well layer and a n-semiconductor layer of III-V group material are deposited to a sapphire substrate of 2 to 8 inches by means of metal organic chemical vapor deposition (MOCVD), and then an LED element of a desired shape is made through various post-processes such as cutting, wiring, packaging or the like. If a display for TV is directly made by using this method, in simple calculation, TV of 40 inches may be produced by connecting 5 to 40 wafers of 2 to 8 inches. Therefore, in order to directly implement a display of a TV level with LED elements by using a known manufacturing technique, there are numerous problems not overcome by the present techniques. In addition, in order to implement full-color, red-green-blue three-color LED elements should be put into a single pixel, and an LED full-color display may not be implemented by simply joining red-green-blue LED wafers.

In order to implement a high efficiency LED display, there may be used a bottom-up manner in which a III-V group film and a nanorod LED element are directly grown at patterned pixel sites of a large-sized glass substrate for an actual display. As known in many studies until now, in the MOCVD method where an III-V group film is grown, a process of directly depositing to a large-sized substrate such as a display for TV is not possible in view of equipment. Moreover, it is known in the art that growing a high crystallinity/high efficiency III-V group film and a nanorod heterojunction LED element on a transparent electrode patterned on a transparent amorphous glass substrate is very difficult in view of crystallography. Due to such technical limits, a method for implementing a full-color display for TV or monitor by directly growing LED elements on a large-sized glass substrate without using a small element is substantially not attempted.

Another approach prosecuted by many researchers to implement an LED display is a bottom-up manner based on the nano technology. In this method, a nanorod-type LED is grown on a single crystal substrate, and then this is partially picked and rearranged in a bottom-up manner on an electrode patterned with pixels, thereby implementing a large-sized display. However, a nanorod LED manufactured in the bottom-up manner has seriously bad light emission efficiency in comparison to a film-type LED grown on an existing wafer. Therefore, even though an LED display is implemented using this technique, the efficiency deterioration problem may not be easily solved for a considerable period. Moreover, in order to arrange nanorod LED elements grown in the bottom-up manner on an electrode by means of self-assembling of the bottom-up manner, it is essential to obtain nanorod elements having the uniform size and height. However, if a nanorod growth method such as vapor-liquid-solid (VLS) method well known in the art is used, the possibility of mass-production of nanorod LED elements having the uniform size and characteristics suitable for self-assembling is very low.

As another scheme, there is a top-down manner in which an LED display is implemented by cutting high efficiency LED elements. Generally, in this method, a display is implemented by arranging a single micro LED element prepared in the top-down manner at each sub-pixel site of a large-sized glass substrate in one-to-one relation. In detail, an LED display of a micrometer size has been developed for a small micro LED display, since individual micro LEDs prepared in the top-down manner are manufactured into each sub-pixel. In this case, after the LED element is grown on a sapphire substrate, the LED element is patterned into a micrometer size to make a micro LED element, and then an electrode is wired, thereby implementing a micro LED display smaller than the wafer substrate size. If this method is used, there is no problem in efficiency, but due to the limits in substrate size and manufacturing processes, it is impossible to implement an LED display of a large size.

As a result, a subminiature LED element manufactured using an existing top-down or bottom-up manner is highly likely to cause problems in efficiency and stability due to the increase of surface defects by an etching work. In addition, in case of an independent subminiature LED element, mutual cohesiveness is generated due to surface polarity among subminiature elements to form aggregates, which may result in many defects in a pixel patterning process. Therefore, manufacturing independent subminiature micro LED elements has a limit in implementing a high efficiency/large-sized LED display which allows mass production. Further, in the case a subminiature LED element prepared according to an existing method is located at a sub-pixel (pixel site) of an LED display substrate, due to the small size of the LED element, the subminiature LED element may not stand upright on the sub-pixel of the LED display but lie down or turn over.

SUMMARY

The present disclosure is directed to providing a manufacturing method of a subminiature LED element, which may solve problems of deteriorated efficiency and stability and aggregation of subminiature LED elements due to the increase of surface defects by an etching work for the subminiature LED elements. The present disclosure is also directed to providing a subminiature LED element, which may be accurately located at a sub-pixel (pixel site) of an LED display without lying or turning over.

In one aspect of the present disclosure, there is provided a manufacturing method of a subminiature LED element, which includes: 1) forming a first conductive semiconductor layer, an active layer and a second conductive semiconductor layer in order on a substrate; 2) etching the first conductive semiconductor layer, the active layer and the second conductive semiconductor layer so that the LED element has a diameter of a nanometer or micrometer level; and 3) forming an insulation film on the outer circumference of the first conductive semiconductor layer, the active layer and the second conductive semiconductor layer and removing the substrate.

According to an embodiment of the present disclosure, the first conductive semiconductor layer may include at least one n-type semiconductor layer, and the second conductive semiconductor layer may include at least one p-type semiconductor layer. According to another embodiment of the present disclosure, Step 2) may include: 2-1) forming a second electrode layer, an insulation layer and a metal mask layer in order on the second conductive semiconductor layer; 2-2) forming a polymer layer on the metal mask layer and patterning the polymer layer with nanometer or micrometer intervals; 2-3) dry-etching or wet-etching the first conductive semiconductor layer, the active layer and the second conductive semiconductor layer according to the pattern with nanometer or micrometer intervals; and 2-4) removing the insulation layer, the metal mask layer and the polymer layer.

According to another embodiment of the present disclosure, Step 2) may include: 2-5) forming a second electrode layer, an insulation layer and a metal mask layer on the second conductive semiconductor layer; 2-6) forming a nanosphere or microsphere monolayer on the metal mask layer and performing self-assembling; 2-7) dry-etching or wet-etching the first conductive semiconductor layer, the active layer and the second conductive semiconductor layer according to the pattern with nanometer or micrometer intervals; and 2-8) removing the insulation layer, the metal mask layer and the monolayer. According to another embodiment of the present disclosure, the nanosphere or microsphere may be made of polystyrene.

According to another embodiment of the present disclosure, Step 3) may include: 3-1) forming a support film on the second electrode layer; 3-2) forming an insulation film on the outer circumference including the first conductive semiconductor layer, the active layer and the second conductive semiconductor layer; 3-3) coating the upper portion of the insulation film with a hydrophobic film; 3-4) removing the substrate; 3-5) forming a first electrode layer at the lower portion of the first conductive semiconductor layer; and 3-6) removing the support film to manufacture a plurality of subminiature LED elements. According to another embodiment of the present disclosure, Step 3) may include: 3-7) forming a support film on the second electrode layer; 3-8) forming an insulation film on the outer circumference including the first conductive semiconductor layer, the active layer and the second conductive semiconductor layer; 3-9) removing the substrate; 3-10) forming a first electrode layer at the lower portion of the first conductive semiconductor layer; 3-11) forming a coupling linker on at least one surface of the first electrode layer and the second electrode layer; and 3-12) removing the support film to manufacture a plurality of subminiature LED elements.

In another aspect of the present disclosure, there is provided a subminiature LED element, which includes: a first conductive semiconductor layer; an active layer formed on the first conductive semiconductor layer; and a semiconductor light emission element of a micrometer or nanometer size including a second conductive semiconductor layer formed on the active layer, wherein the outer circumference of the semiconductor light emission element is coated with an insulation film. According to an embodiment of the present disclosure, the upper portion of the insulation film may be coated with a hydrophobic film. According to another embodiment of the present disclosure, a first electrode layer may be formed at the lower portion of the first conductive semiconductor layer, and a second electrode layer may be formed at the upper portion of the second conductive semiconductor layer.

According to another embodiment of the present disclosure, a coupling linker for self-assembling may be provided to at least one of the lower surface of the first electrode layer and the upper surface of the second electrode layer. According to another embodiment of the present disclosure, the coupling linker may be complementarily coupled to a substrate of an LED display. According to another embodiment of the present disclosure, the first conductive semiconductor layer may include at least one n-type semiconductor layer, and the second conductive semiconductor layer may include at least one p-type semiconductor layer. According to another embodiment of the present disclosure, the insulation film may include at least one selected from the group consisting of $SiO_2$, $Si_3N_4$, $Al_2O_3$ and $TiO_2$, the hydrophobic film may include at least one of SAMs and fluorine polymer, and the coupling linker may include a thiol group.

Hereinafter, in the present disclosure, when it is expressed that any layer (film), region, pattern or structure is formed "at the upper portion of (on)" or "at the lower portion of (under)" any layer (film), region or pattern, the expressions "the upper portion (on)" and "the lower portion (under)" include both "directly" and "indirectly". In addition, the criterion of "upper (on)" or "lower (under)" of each layer will be described based on the figures.

The manufacturing method of a subminiature LED element according to the present disclosure may solve problems of existing subminiature LED elements, namely the increase of surface defects by an etching work, resultant deteriorated efficiency and stability and aggregation among subminiature LED elements. In addition, the subminiature LED element according to the present disclosure does not cause a surface defect and aggregation, and the subminiature LED element may be accurately located at a sub-pixel (pixel site) of an LED display without lying or turning over, thereby greatly improving the efficiency of the LED display. Moreover, since the subminiature LED element according to the present disclosure may be freely assembled to a desired pixel pattern location by combining the coupling linkers, the LED display may be applied in various ways.

DETAILED DESCRIPTION

Hereinafter, the present disclosure will be described in detail with reference to the accompanying drawings. As described above, a subminiature LED element manufactured using an existing top-down or bottom-up manner is highly likely to cause problems such as deteriorated efficiency and stability due to the increase of surface defects by an etching work. In addition, in case of an independent subminiature LED element, mutual cohesiveness is generated due to surface polarity among subminiature elements to form aggregates, which may result in many defects in a pixel patterning process. Therefore, manufacturing independent subminiature micro LED elements has a limit in implementing a high efficiency/large-sized LED display which allows mass production.

Further, in the case a subminiature LED element prepared according to an existing method is located at a sub-pixel (pixel site) of an LED display substrate, due to the small size of the LED element, the subminiature LED element may not stand upright on the sub-pixel of the LED display but lie down or turn over. In this regard, the present disclosure provides a manufacturing method of a subminiature LED element, which includes: 1) forming a first conductive semiconductor layer, an active layer and a second conductive semiconductor layer in order on a substrate; 2) etching the first conductive semiconductor layer, the active layer and the second conductive semiconductor layer so that the LED element has a diameter of a nanometer or micrometer level; and 3) forming an insulation film on the outer circumference of the first conductive semiconductor layer, the active layer and the second conductive semiconductor layer and removing the substrate.

Figure 1:
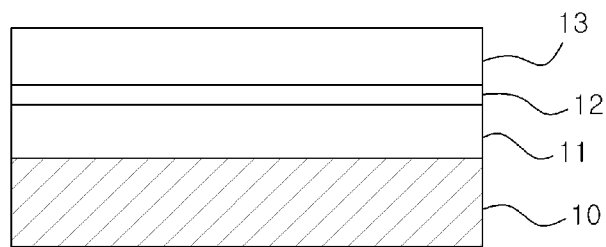
FIG. 1 is a sectional view for illustrating a step of forming an LED basic element layer according to an embodiment of the present disclosure.

First, in Step 1), a first conductive semiconductor layer, an active layer and a second conductive semiconductor layer are formed on a substrate in order. In detail, FIG. 1 is a sectional view for illustrating a step of forming an LED basic element layer according to an embodiment of the present disclosure, which includes a step of forming a first conductive semiconductor layer 11, an active layer 12 and a second conductive semiconductor layer 13 on a substrate 10.

The substrate 10 may use a penetrating substrate such as a sapphire substrate ($Al_2O_3$) and a glass substrate. In addition, the substrate 10 may be selected from a group consisting of GaN, SiC, ZnO, Si, GaP and GaAs, or a conductive substrate. Hereinafter, this embodiment will be described based on a sapphire substrate. The upper surface of the substrate 10 may have an uneven pattern.

A nitride semiconductor is grown on the substrate 10, and the growth device may use electron beam deposition, physical vapor deposition (PVD), chemical vapor deposition (CVD), plasma laser deposition (PLD), dual-type thermal evaporator, sputtering, metal organic chemical vapor deposition (MOCVD) or the like, without being limited thereto. A buffer layer (not shown) and/or an undoped semiconductor layer (not shown) may be formed on the substrate 10. The buffer layer is a layer for reducing a difference in a lattice constant from the substrate 10 and may be formed with at least one of GaN, InN, AlN, InGaN, AlGaN, InAlGaN and AlInN. The undoped semiconductor layer may be implemented as an undoped GaN layer, and serves as a substrate at which the nitride semiconductor grows. The buffer layer and the undoped semiconductor layer may be formed selectively, or both of them may also not be formed. According to an embodiment of the present disclosure, the substrate may have a thickness of 400 to 1500 µm, without being limited thereto.

A first conductive semiconductor layer 11 is formed on the substrate 10. The first conductive semiconductor layer 11 may include, for example, an n-type semiconductor layer. The n-type semiconductor layer may be at least one selected from semiconductor materials having a composition formula of $In_xAl_yGa_{1-x-y}N$ ($0 \le x \le 1$, $0 \le y \le 1$, $0 \le x+y \le 1$), for example InAlGaN, GaN, AlGaN, InGaN, AlN, InN or the like, and may also be doped with a first conductive dopant (e.g., Si, Ge, Sn or the like). According to an embodiment of the present disclosure, the first conductive semiconductor layer may have a thickness of 1.5 to 5 µm, without being limited thereto.

The active layer 12 is formed on the first conductive semiconductor layer 11 and may have a single or multi quantum well structure. A clad layer (not shown) doped with a conductive dopant may be formed on and/or under the active layer 12, the clad layer doped with a conductive dopant may be implemented as an AlGaN layer or an InAlGaN layer. In addition, materials such as AlGaN, AlInGaN or the like may also be used as the active layer 12. The active layer 12 generates light by coupling of an electron-hole pair when an electric field is applied thereto. According to an embodiment of the present disclosure, the active layer may have a thickness of 0.05 to 0.25 µm, without being limited thereto.

A second conductive semiconductor layer 13 is formed on the active layer 12, and the second conductive semiconductor layer 13 may be implemented with at least one p-type semiconductor layer. The p-type semiconductor layer may be at least one selected from semiconductor materials having a composition formula of $In_xAl_yGa_{1-x-y}N$ ($0 \le x \le 1$, $0 \le y \le 1$, $0 \le x+y \le 1$), for example InAlGaN, GaN, AlGaN, InGaN, AlN, InN or the like, and may also be doped with a second conductive dopant (e.g., Mg). Here, the light emitting structure includes the first conductive semiconductor layer 11, the active layer 12 and the second conductive semiconductor layer 13 as final components, and may further include another fluorescent layer, active layer, semiconductor layer and/or electrode layer on or under each layer. According to an embodiment of the present disclosure, the second conductive semiconductor layer may have a thickness of 0.08 to 0.25 µm, without being limited thereto.

Next, in Step 2), the LED element is etched to have a diameter of a nanometer or micrometer size, including the first conductive semiconductor layer, the active layer and the second conductive semiconductor layer. For this, according to an embodiment of the present disclosure, the method may further include: 2-5) forming a second electrode layer, an insulation layer and a metal mask layer on the second conductive semiconductor layer; 2-6) forming a nanosphere or microsphere monolayer on the metal mask layer and performing self-assembling; 2-7) dry-etching or wet-etching the first conductive semiconductor layer, the active layer and the second conductive semiconductor layer according to the pattern with nanometer or micrometer intervals; and 2-8) removing the insulation layer, the metal mask layer and the monolayer.

Figure 2:
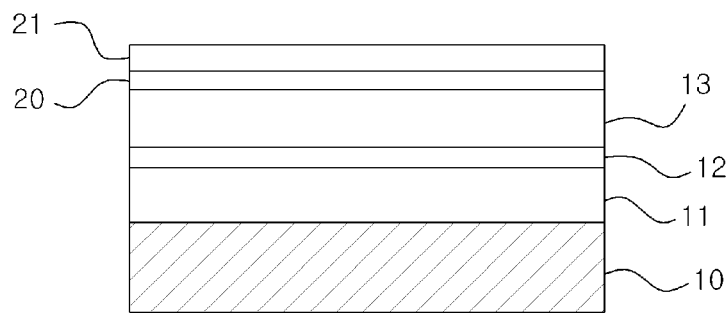
FIG. 2 is a sectional view for illustrating a step of forming a second electrode layer, an insulation layer and a metal mask layer on a second conductive semiconductor layer of the present disclosure.

In detail, FIG. 2 is a sectional view for illustrating a step of forming a second electrode layer 20, an insulation layer 21 and a metal mask layer 22 on the second conductive semiconductor 13 of the present disclosure. First, the second electrode layer 20 may be made of metals or metal oxides used for a common LED element, preferably Cr, Ti, Al, Au, Ni, ITO, their oxides or alloys solely or in combination, without being limited thereto. According to an embodiment of the present disclosure, the metal mask layer may have a thickness of 0.02 to 0.1 µm, without being limited thereto.

The insulation layer 21 formed on the second electrode layer 20 may play a role of a mask for successively etching the second electrode layer, the second conductive semiconductor layer, the active layer and the first conductive semiconductor layer and may use oxides or nitrides, representatively, silicon oxide ($SiO_2$) or silicon nitride (SiN), without being limited thereto. According to an embodiment of the present disclosure, the insulation layer may have a thickness of 0.5 to 1.5 µm, without being limited thereto. The metal mask layer 22 formed on the insulation layer 21 plays a role of a mask for etching and may be made of metals commonly used in the art, representatively chrome (Cr), without being limited thereto. According to an embodiment of the present disclosure, the metal mask layer may have a thickness of 30 to 150 nm, without being limited thereto.

Figure 3:
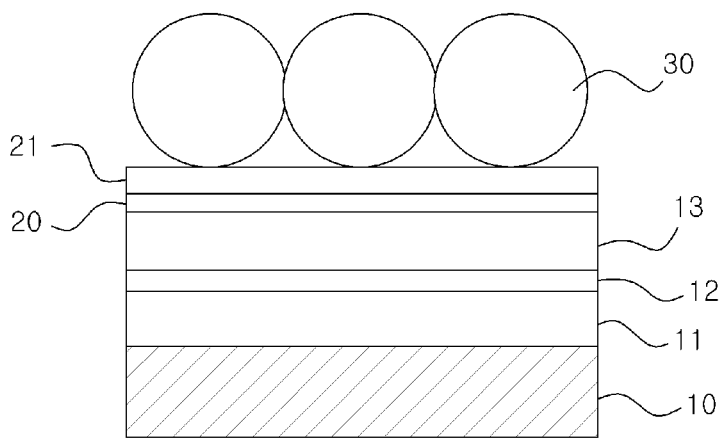
FIG. 3 is a sectional view for illustrating a step of forming a nanosphere or microsphere monolayer on the metal mask layer of the present disclosure.

FIG. 3 is a sectional view for illustrating a step of forming a nanosphere or microsphere monolayer 30 on the metal mask layer 22 of the present disclosure. In detail, the nanosphere or microsphere monolayer is formed to play a role of a mask for etching the metal mask layer 22, and sphere particles may be formed by using the self-assembling characteristic of the spheres. For perfectly arranging one layer by means of self-assembling of spears, spheres are put afloat on the water surface to move at a certain speed for the purpose of self-assembling of them. Since a sphere area formed by spreading in the water is small and irregular, a first sphere layer having a large and regular arrangement may be formed by applying additional energy and a surfactant, and a sphere monolayer regularly arranged on a metal layer may be formed by ladling the first sphere layer onto the metal mask layer 22. The diameter of sphere particles may be selected according to a desired diameter of a subminiature LED element to be finally produced, and preferably, polystyrene spheres, silica spheres or the like having a diameter of 50 to 3000 nm may be used, without being limited thereto.

Figure 4:
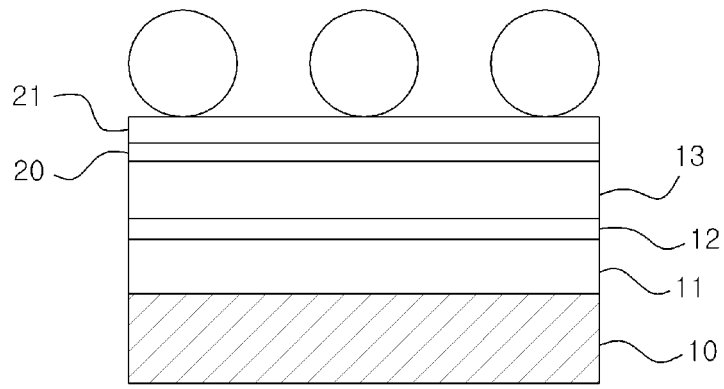
FIG. 4 is a sectional view for illustrating a step of ashing the nanosphere or microsphere monolayer of the present disclosure.

FIG. 4 is a sectional view for illustrating a step of ashing the nanosphere or microsphere monolayer 30 of the present disclosure, in which sphere particles are spaced apart from each other. This may be performed by a common sphere monolayer ashing process, and preferably, the ashing process may be performed by means of oxygen ($O_2$)-based reactive ion ashing and plasma ashing (e.g.).

Figure 5:
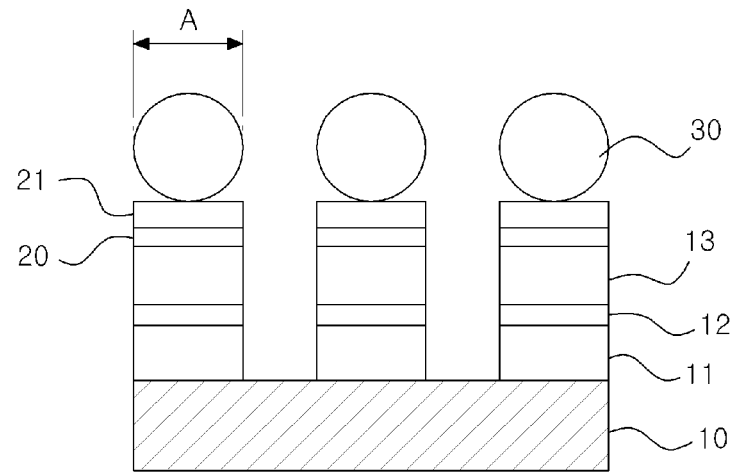
FIG. 5 is a sectional view for illustrating an etching step of the present disclosure.

FIG. 5 is a sectional view for illustrating an etching step of the present disclosure, in which the sphere particles spaced apart from each other during the ashing process of FIG. 4 are etched to form holes. In this case, a portion where the sphere particles 30 are formed is not etched, and a spatial portion between the sphere particles is etched to form a hole. The hole may be selectively formed from the metal mask layer 22 to the upper portion of the substrate 10. This etching process may adopt dry etching such as reactive ion etching (RIE) or inductively coupled plasma reactive ion etching (ICP-RIE).

The dry etching allows one-directional etching, which is suitable for the above patterning work, different from the wet etching. In other words, even though the wet etching performs isotropic etching in which the etching work is performed in all directions, but the dry etching enables to etch in a depth direction to form a hole, different from the wet etching, and thus allows adjusting the hole size and forming intervals into a desired pattern.

At this time, if the RIE or the ICP-RIE is used, an etching gas available for a metal mask may include $Cl_2$, $O_2$ or the like. An interval (A) of the LED element manufactured by the etching process is identical to the diameter of the sphere particles 30. In this case, the interval (A) of the LED element may have a nanometer or micrometer unit, more preferably 50 to 3000 nm.

Figure 6:
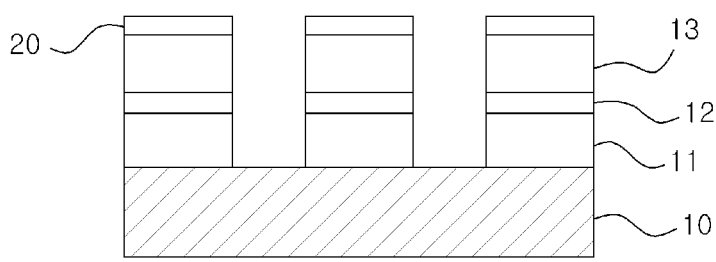
FIG. 6 is a sectional view for illustrating a step of removing the sphere monolayer, the metal mask layer and the insulation layer according to the present disclosure.

FIG. 6 shows a step of removing the sphere particles 30, the metal mask layer 22 and the insulation layer 21 after the etching process, which may be performed by wet etching or dry etching. According to another embodiment of the present disclosure, Step 2) may include: 2-1) forming a second electrode layer, an insulation layer and a metal mask layer in order on the second conductive semiconductor layer; 2-2) forming a polymer layer on the metal mask layer and patterning the polymer layer with nanometer or micrometer intervals; 2-3) dry-etching or wet-etching the first conductive semiconductor layer, the active layer and the second conductive semiconductor layer according to the pattern with nanometer or micrometer intervals; and 2-4) removing the insulation layer, the metal mask layer and the polymer layer.

In detail, after a second electrode layer, a metal mask layer and an insulation layer are formed on the second conductive semiconductor layer, a common polymer layer available for common lithography is formed on the metal mask layer. In addition, the polymer layer is patterned with nanometer or micrometer intervals by means of photo lithography, e-beam lithography, or nano implant lithography, and then dry-etched or wet-etched. After that, the insulation layer, the metal mask layer and the polymer layer are removed.

Next, in Step 3), an insulation film is formed on the outer circumference of the first conductive semiconductor layer, the active layer and the second conductive semiconductor layer, and the substrate is removed, thereby manufacturing a subminiature LED element. In detail, according to an embodiment of the present disclosure, Step 3) may include: 3-1) forming a support film on the second electrode layer; 3-2) forming an insulation film on the outer circumference including the first conductive semiconductor layer, the active layer and the second conductive semiconductor layer; 3-3) coating the upper portion of the insulation film with a hydrophobic film; 3-4) removing the substrate; 3-5) forming a first electrode layer at the lower portion of the first conductive semiconductor layer; and 3-6) removing the support film to manufacture a plurality of subminiature LED elements.

Figure 7:
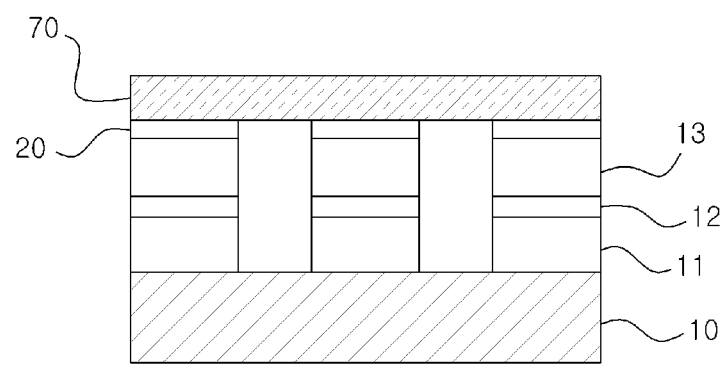
FIG. 7 is a sectional view for illustrating a step of attaching a support film onto the second electrode layer of the present disclosure.

FIG. 7 is a sectional view for illustrating a step of attaching a support film 70 onto the second electrode layer 20 of the present disclosure. The support film 70 supports the plurality of subminiature LED elements not to be dispersed when the substrate 10 is removed by means of laser lift-off (LLO), and is also attached to prevent the LED element from cracking. The support film may be made of polymer epoxy or bonding metal and have a thickness of 0.3 to 70 μm, without being limited thereto.

Figure 8:
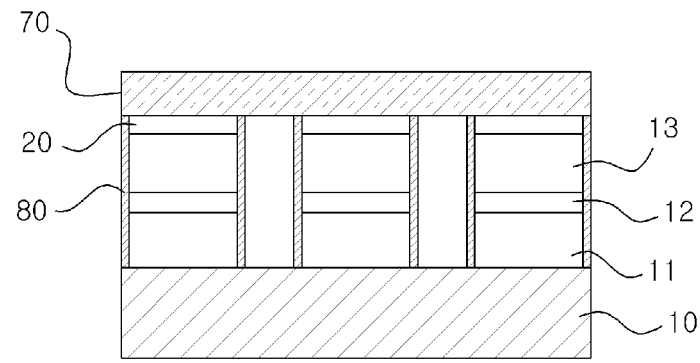
FIG. 8 is a sectional view for illustrating a step of coating the outer circumference of the LED element of the present disclosure with an insulation film.

FIG. 8 shows that an insulation film 80 is formed on the outer circumference of the first conductive semiconductor layer, the active layer and the second conductive semiconductor layer with respect to the subminiature LED elements at which the support film of the present disclosure is formed. By doing so, surface defects of the subminiature LED element may be minimized, which improves life cycle and efficiency. The insulation film may be formed on the outer circumference of not only the first conductive semiconductor layer 11, the active layer 12 and the second conductive semiconductor layer 13 but also the first electrode layer and/or the second electrode layer and other layers.

In order to form the insulation film on the outer circumference of the subminiature LED elements, the outer circumference of the subminiature LED elements to which the support film 70 and the substrate 10 are attached may be coated with or dipped in insulation material, without being limited thereto. Material available for the insulation film may be at least one selected from the group consisting of $SiO_2$, $Si_3N_4$, $Al_2O_3$ and $TiO_2$, without being limited thereto. For example, the $Al_2O_3$ film may be formed by means of atomic layer deposition (ALD), and a film may be formed by supplying trimethyl aluminum (TMA) and $H_2O$ source in a pulse form and using chemical absorption and desorption.

Figure 9:
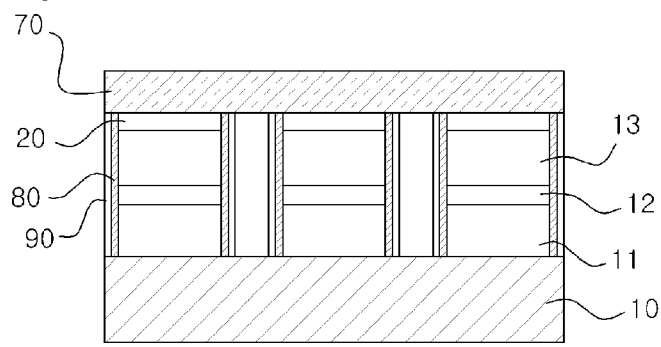
FIG. 9 is a sectional view for illustrating a step of coating the insulation film formed on the outer circumference of the LED element of the present disclosure with a hydrophobic film.

FIG. 9 is a sectional view for illustrating a step of coating the insulation film 80 formed on the outer circumference of the LED element of the present disclosure with a hydrophobic film 90. The hydrophobic film 90 gives a hydrophobic property to the surface of the subminiature LED element, thereby preventing elements from cohering. Therefore, it is possible to reduce characteristic deterioration of independent subminiature elements and eliminate many defects of subminiature LED elements in the pixel patterning process. Moreover, the hydrophobic film 90 may be formed on the insulation film 80. In this case, the hydrophobic film may use any material which can be formed on the insulation film and prevent cohesion among the subminiature LED elements, without limitation, for example octadecyltrichlorosilane (OTS), self-assembled monolayers (SAMs) such as fluoroalkyltrichlorosilane, perfluoroalkyltriethoxysilane or the like, fluoropolymers such as Teflon, Cytop or the like, solely or in combination.

Figure 10:
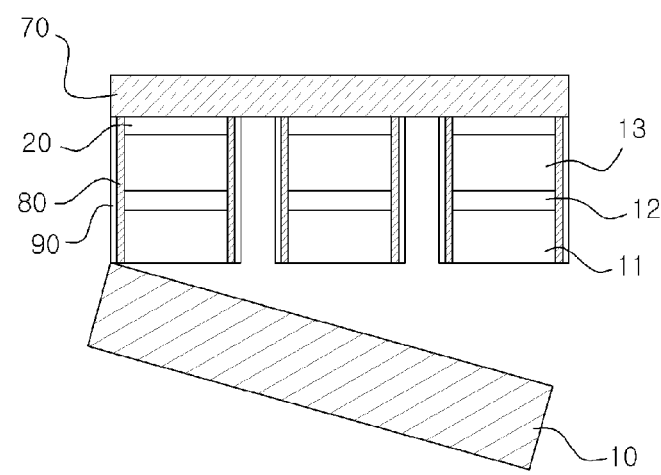
FIG. 10 is a sectional view for illustrating a step of removing the substrate formed under the first conductive semiconductor layer of the LED element of the present disclosure.

FIG. 10 is a sectional view for illustrating a step of removing the substrate 10 formed under the first conductive semiconductor layer 11 of the LED element of the present disclosure. The substrate 10 may be removed using a common method, preferably chemical lift-off (CLO) or laser lift-off (LLO), without being limited thereto.

Figure 11:
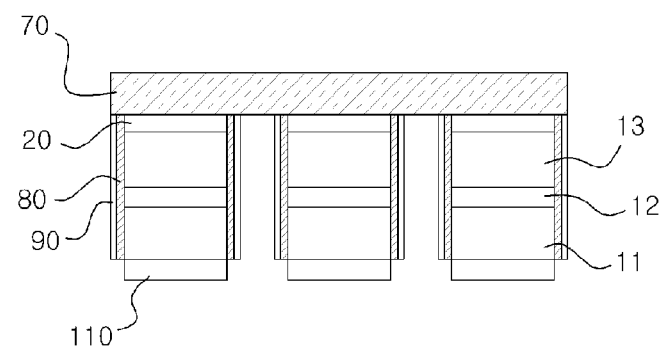
FIG. 11 is a sectional view for illustrating a step of depositing an electrode under the first conductive semiconductor layer of the present disclosure from which the substrate is removed.

FIG. 11 is a sectional view for illustrating a step of forming a first electrode 110 under the first conductive semiconductor layer 11 from which the substrate 10 is removed according to the present disclosure. The first electrode 110 may use any material commonly available for the LED element without limitation, preferably Cr, Ti, Al, Au, Ni, ITO, their oxides or alloys alone or in combination. In addition, the electrode may have a thickness of 0.02 to 1 μm, without being limited thereto.

Figure 12:
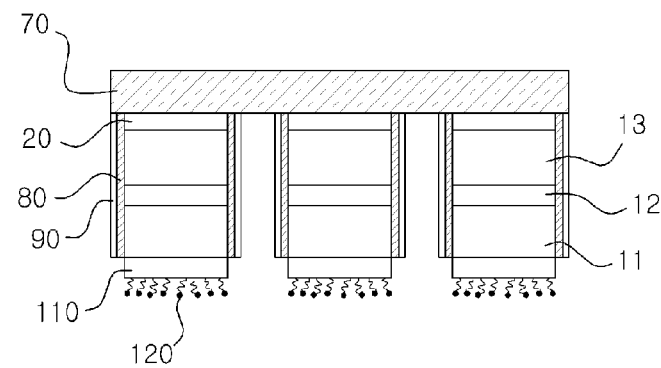
FIG. 12 is a sectional view for illustrating a step of coating the surface of the electrode of the present disclosure with a coupling linker for self-assembling.

FIG. 12 is a sectional view for illustrating a step of coating the surface of the first electrode 110 of the present disclosure with a coupling linker 120 for self-assembling. As described above, since the subminiature LED element has a very small size, when being attached to a sub-pixel (pixel site) of the LED display substrate, the subminiature LED element may not stand upright but lie down or turn over. In order to prevent this, the surface of the first electrode 110 is coated with a coupling linker 120 for self-assembling, and a second linker (not shown) capable of being coupled to the coupling linker 120 is formed at the sub-pixel (pixel site) of the LED display substrate. In this case, even though the subminiature LED element is transferred or added to the sub-pixel in an ink or paste form, the subminiature LED element does not lie down or turn over but the electrode surface may be attached to a sub-pixel at a desired location. In addition, even though the second linker is not formed, if a functional group remaining in the coupling linker is coupled to the surface of the sub-pixel of the LED display substrate, it is possible to prevent the subminiature LED element from lying or turning over without standing upright.

The coupling linker should be coupled to an electrode surface of the subminiature LED element, the surface of the sub-pixel of the display substrate and/or the second linker formed at the sub-pixel. For this, the coupling linker may have at least two functional groups. In detail, the coupling linker may contain thiol-based aminoethanethiol or its oxide, which reacts with metal, and aminopropyltriethoxysilane reacting with it, without being limited thereto. In addition, the second linker formed on the surface of the sub-pixel of the display substrate may use any material capable of being complementarily coupled with the coupling linker of the present disclosure without limitation, preferably materials in the same group as the coupling linker, without being limited thereto.

Figure 13:
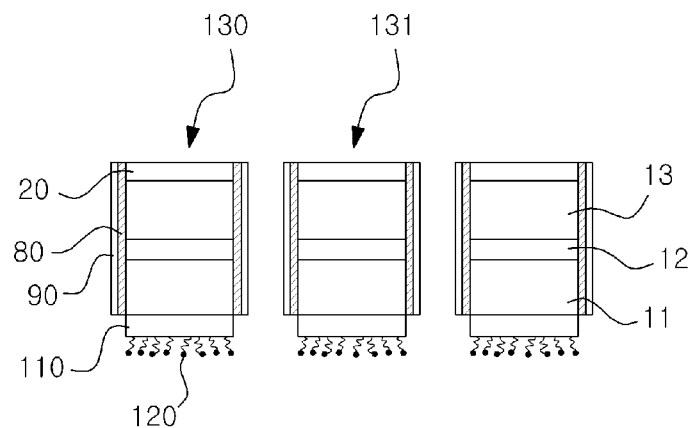
FIG. 13 is a sectional view for illustrating a step of preparing independent subminiature LED elements by removing the support film according to the present disclosure.

FIG. 13 shows that independent subminiature LED elements 130, 131 are manufactured by removing the support film 70. Meanwhile, according to another embodiment of the present disclosure, the coupling linker 120 may be formed on at least one surface of the second electrode 20 and the first electrode 110 after the support film 70 is removed.

Meanwhile, the present disclosure provides a subminiature LED element, which includes: a first conductive semiconductor layer; an active layer formed on the first conductive semiconductor layer; and a semiconductor light emission element of a micrometer or nanometer size including a second conductive semiconductor layer formed on the active layer, wherein the outer circumference of the semiconductor light emission element is coated with an insulation film.

Figure 14:
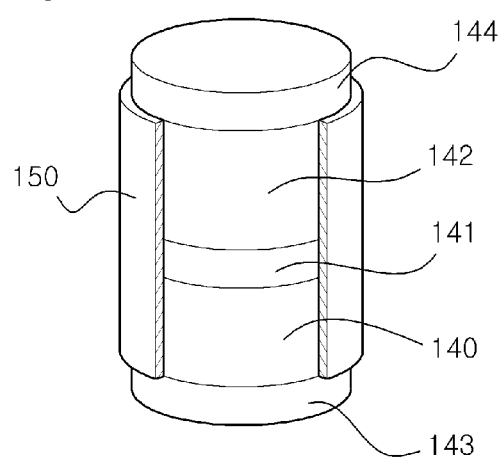
FIG. 14 is a perspective view showing a subminiature LED element in which the outer circumference of the LED element is coated with an insulation film according to the present disclosure.

FIG. 14 is a perspective view showing a subminiature LED element of the present disclosure. The subminiature LED element according to the present disclosure includes an active layer 141 formed on the first conductive semiconductor layer 140 and a second conductive semiconductor layer 142 formed on the active layer 141. A first electrode 143 may be formed under the first conductive semiconductor layer 140, and a second electrode 144 may be formed on the second conductive semiconductor layer 142. A buffer layer, an active layer, a fluorescent layer and/or a semiconductor layer may also be further provided as described above. Meanwhile, the insulation film 150 may be formed to surround the partial or entire outer circumference of the active layer 141 formed on the first conductive semiconductor layer 140 and the second conductive semiconductor layer 142 formed on the active layer 141. In addition, the insulation film 150 may also be formed to surround the partial or entire outer circumference of the first electrode 143 and/or the second electrode 144.

Figure 15:
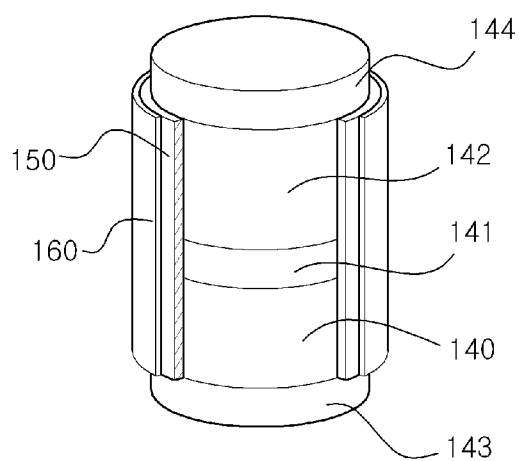
FIG. 15 is a perspective view showing a subminiature LED element in which the insulation film formed on the outer circumference of the LED element is coated with a hydrophobic film according to the present disclosure.

FIG. 15 is a perspective view showing a subminiature LED element according to an embodiment of the present disclosure in which the insulation film 150 formed on the outer circumference according to an embodiment of the present disclosure is coated with a hydrophobic film 160 in order to prevent cohesion among the subminiature LED elements. The hydrophobic film 160 may be formed to surround a part or entire of the insulation film 150.

Figure 16:
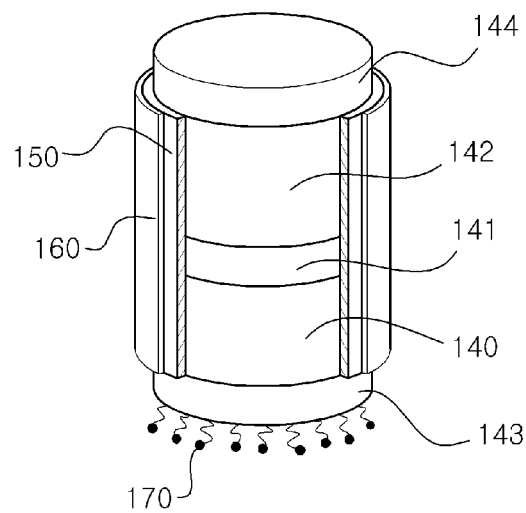
FIG. 16 a perspective view showing a subminiature LED element in which a coupling linker for self-assembling is formed on the surface of the electrode of the present disclosure.

FIG. 16 is a perspective view showing a subminiature LED element in which a coupling linker for self-assembling is formed on the electrode surface of the present disclosure. As described above, since the subminiature LED element has a very small size, when being attached to a sub-pixel (pixel site) of the LED display substrate, the subminiature LED element may not stand upright but lie down or turn over. In order to prevent this, a coupling linker 170 for self-assembling may be formed on at least one surface of the first electrode 143 and the second electrode 144. In detail, the coupling linker 170 is formed on the surface of the first electrode 143, and a second linker (not shown) capable of being coupled with the coupling linker 170 is formed at a corresponding sub-pixel (pixel site) of the LED display substrate. In this case, even though the subminiature LED element is transferred or added to the sub-pixel in an ink or paste form, the subminiature LED element does not lie down or turn over but the electrode surface may be attached to a sub-pixel at a desired location.

Further, if the coupling linker 170 is formed on both the first electrode 143 and the second electrode 144, a part of the subminiature LED elements coupled to the sub-pixels (pixel sites) of the LED display substrate will be coupled to the first electrode 143, and the other will be coupled to the second electrode 144. In this case, if an AC current is applied to the LED display substrate, the LED display may be driven.

Figure 17:
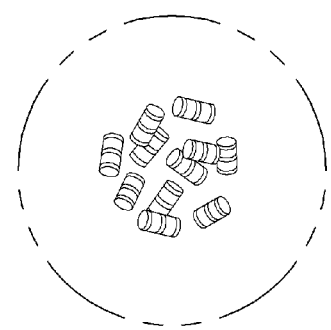
FIG. 17 shows ink or paste including the subminiature LED elements of the present disclosure.

The subminiature LED element of the present disclosure may have a cylindrical shape, a rectangular shape or the like without limitation, but preferably a cylindrical shape. In case of the cylindrical shape, the diameter (the diameter of the circle) may be 50 to 3000 nm, and the height may be 1.5 to 7 μm, without being limited thereto. FIG. 17 shows ink or paste including the subminiature LED elements of the present disclosure, which may be transferred directly or in an ink or paste form to a sub-pixel of the display substrate of the subminiature LED elements according to the present disclosure.

Figure 18:
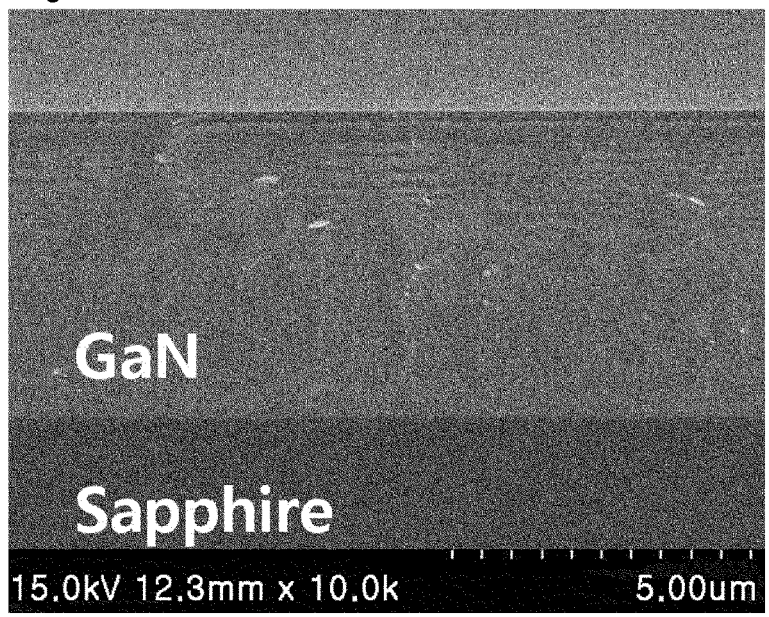
FIG. 18 is an electron microscope photograph showing a section of the LED basic element layer of the present disclosure.

Hereinafter, the present disclosure will be described in more detail based on examples, but the following examples are just for better understanding of the present disclosure but not intended to limit the scope of the present disclosure. In order to make an LED basic element layer (GaN), a buffer layer or undoped semiconductor layer (undoped GaN, 2.4 to 2.8 µm in thickness), a first conductive semiconductor layer (n-type GaN, 2.0 to 2.4 µm in thickness), an active layer (InGaN/GaN multiple quantum well, 100 to 140 nm), and a second conductive semiconductor layer (p-type GaN, 200 nm in thickness) were formed on a sapphire substrate (2-inch wafer size, 430±25 µm) by means of MOCVD (see FIG. 18).

Figure 19:
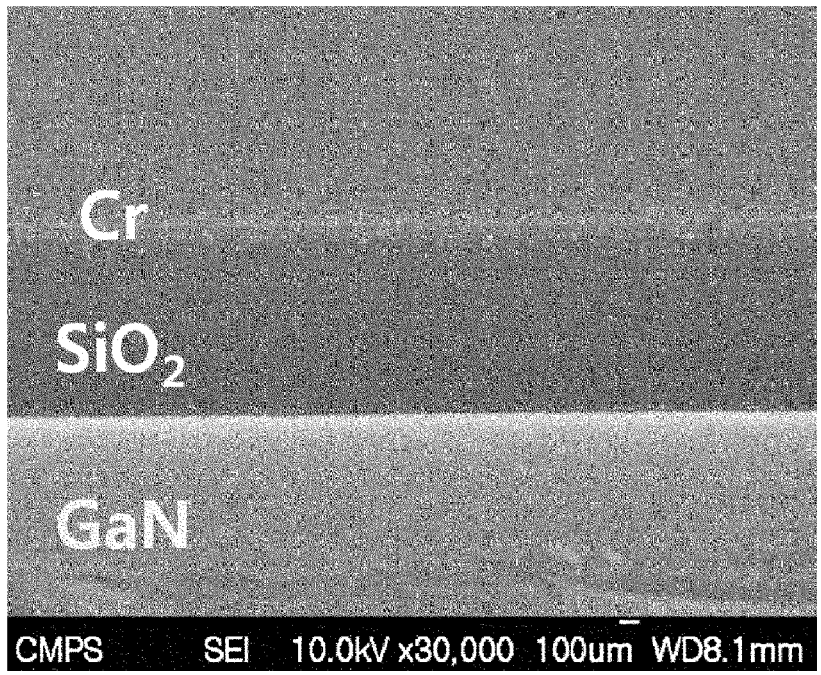
FIG. 19 is an electron microscope photograph showing sections of the present disclosure in which an insulation layer and a metal mask layer are formed on the second conductive semiconductor layer.
Figure 20A:
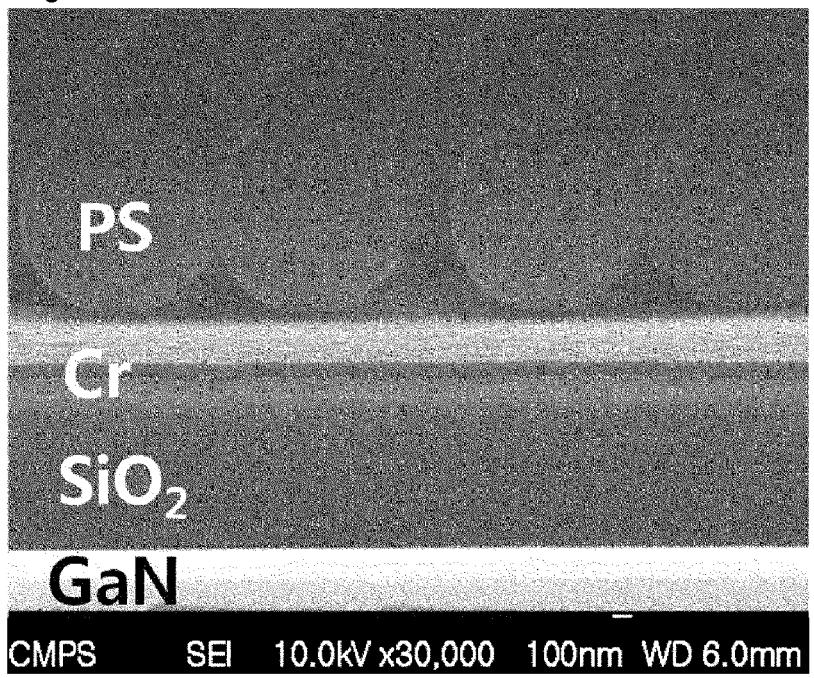
FIG. 20a is an electron microscope photograph showing a section of the present disclosure in which a nano-sphere monolayer is formed on the metal mask layer.
Figure 20B:
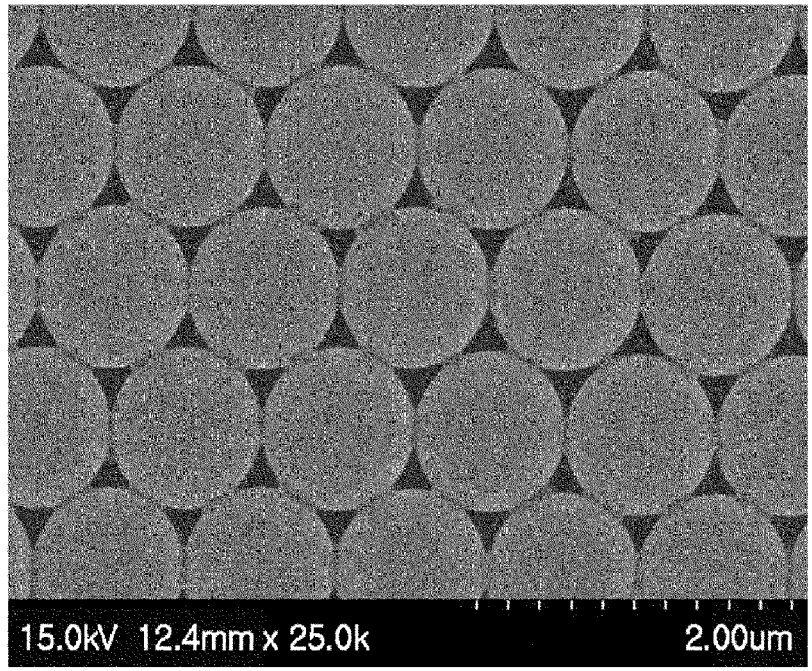
FIG. 20b is an electron microscope photograph showing a plane thereof.
Figure 21A:
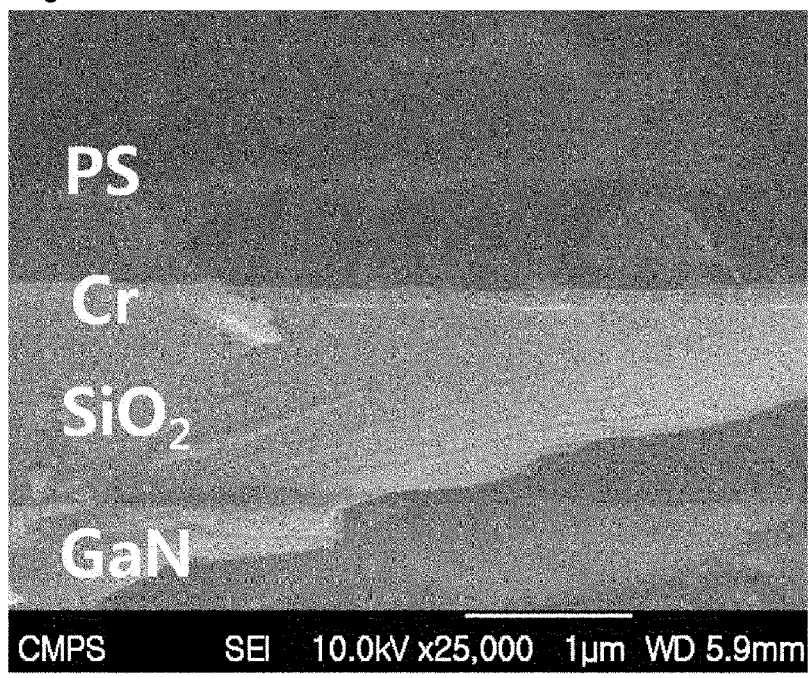
FIG. 21a is an electron microscope photograph showing a section of the present disclosure in which the nano-sphere monolayer has been washed under an $O_2$ gas circumstance.
Figure 21B:
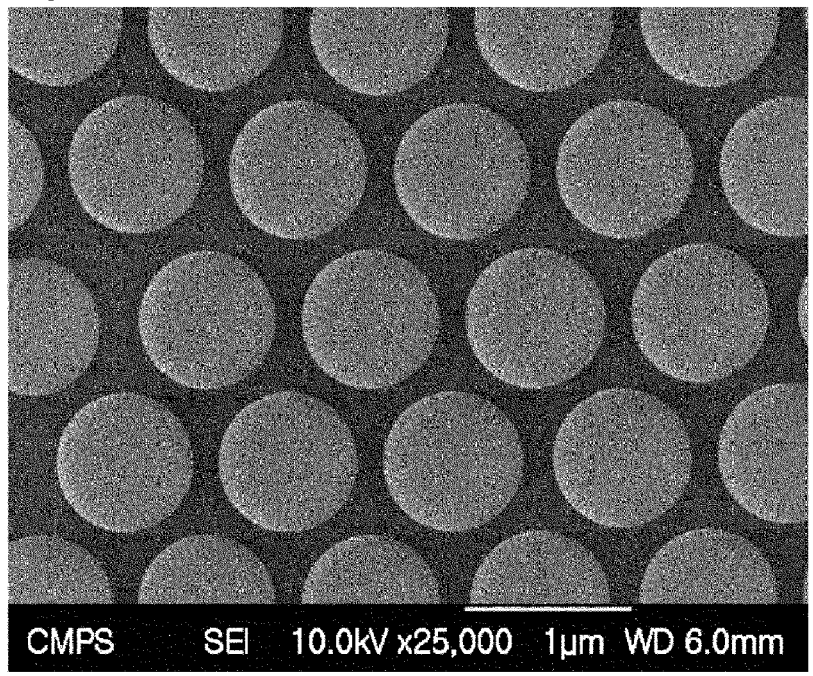
FIG. 21b is an electron microscope photograph showing a plane thereof.
Figure 22A:
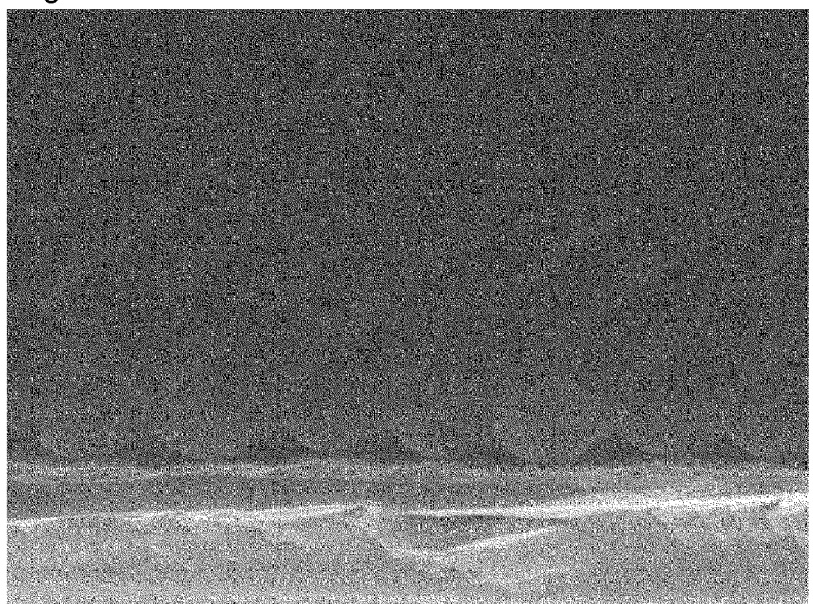
FIG. 22a is an electron microscope photograph showing a section of the present disclosure in which the metal mask layer has been etched under a $Cl_2$ gas circumstance while using a nano-sphere of a reduced size as a mask.
Figure 22B:
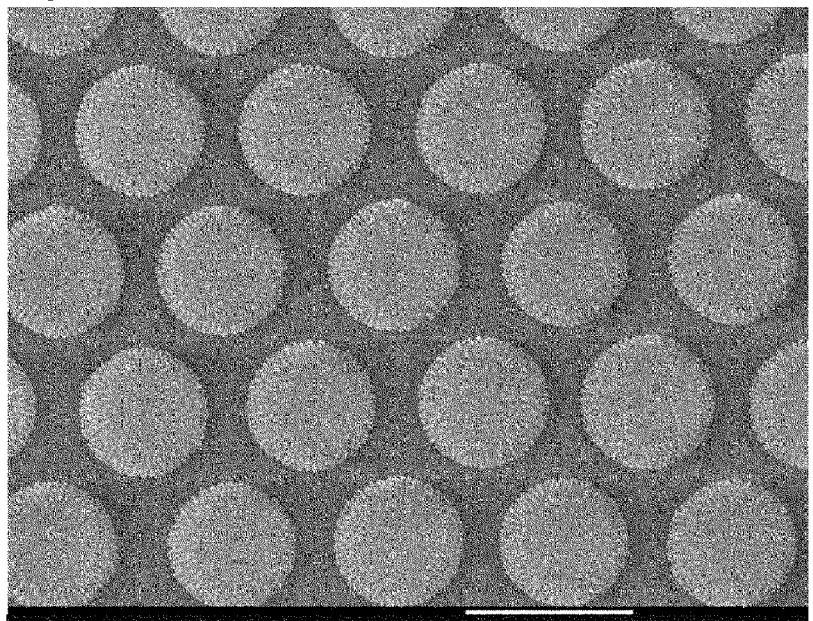
FIG. 22b is an electron microscope photograph showing a plane thereof.
Figure 23A:
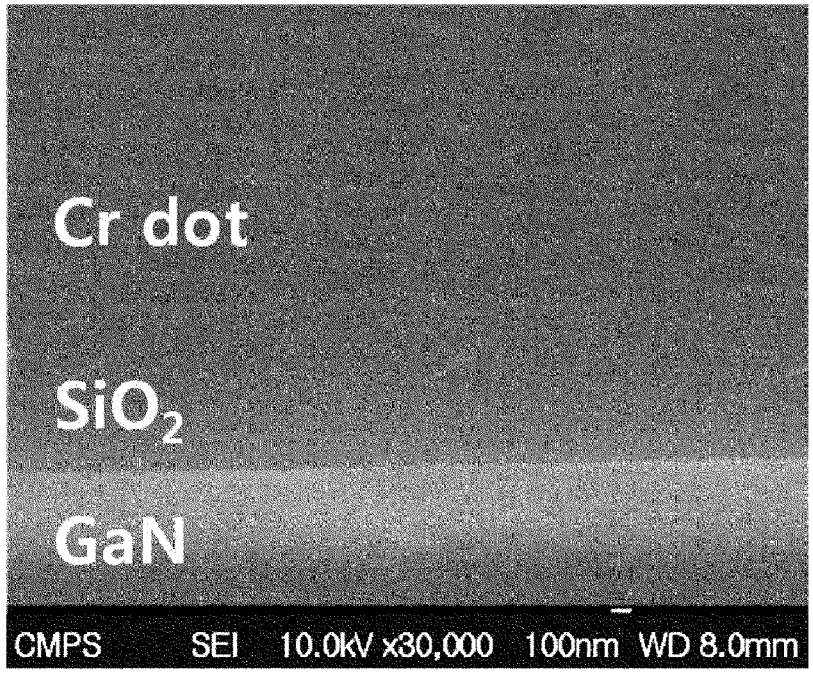
FIG. 23a is an electron microscope photograph showing a section of the metal mask layer pattern of the present disclosure, which has been transferred according to a shape of polystyrene by the etching process.
Figure 23B:
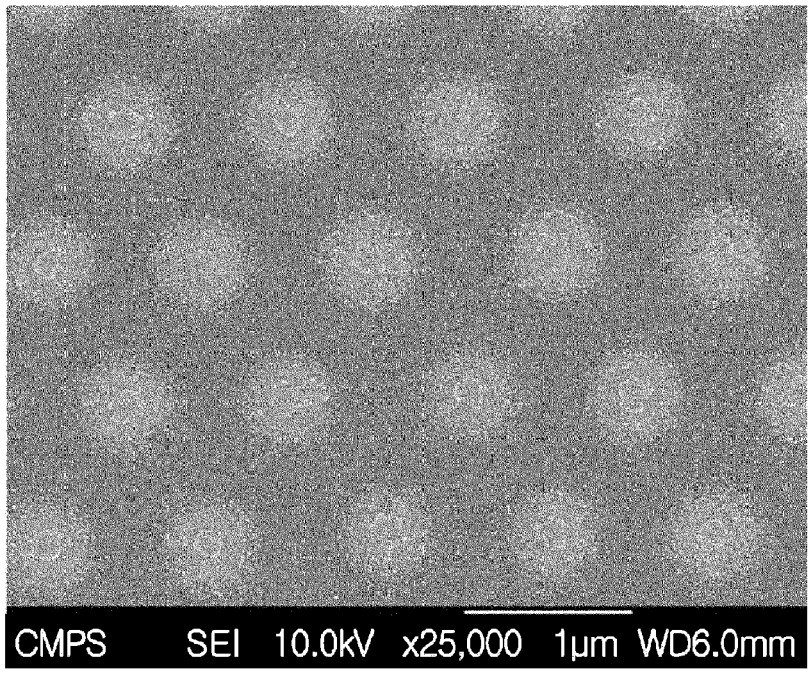
FIG. 23b is an electron microscope photograph showing a plane thereof.
Figure 24A:
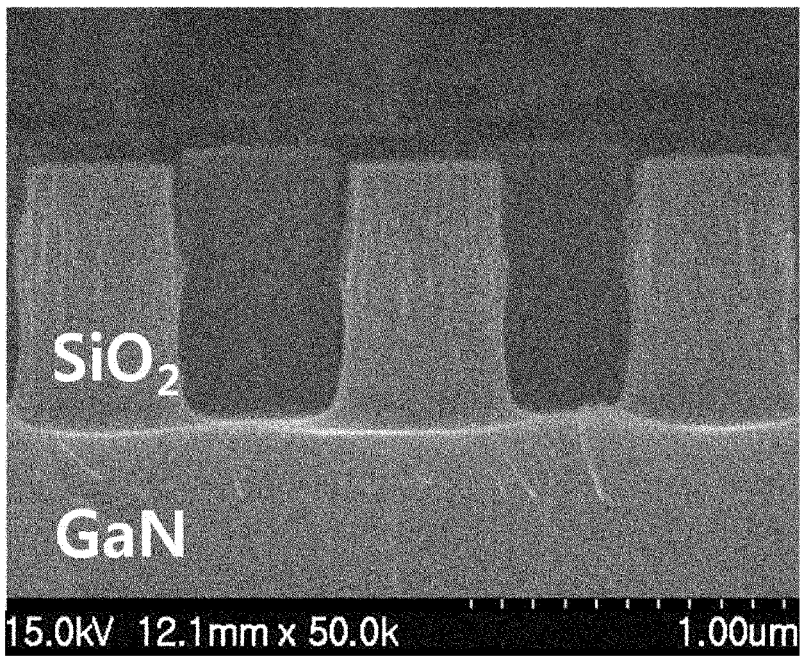
FIG. 24a is an electron microscope photograph showing a section of the present disclosure in which $SiO_2$ (the insulation layer) has been etched under a $CF_4$ and $O_2$ gas circumstance by using the metal mask layer pattern.
Figure 24B:
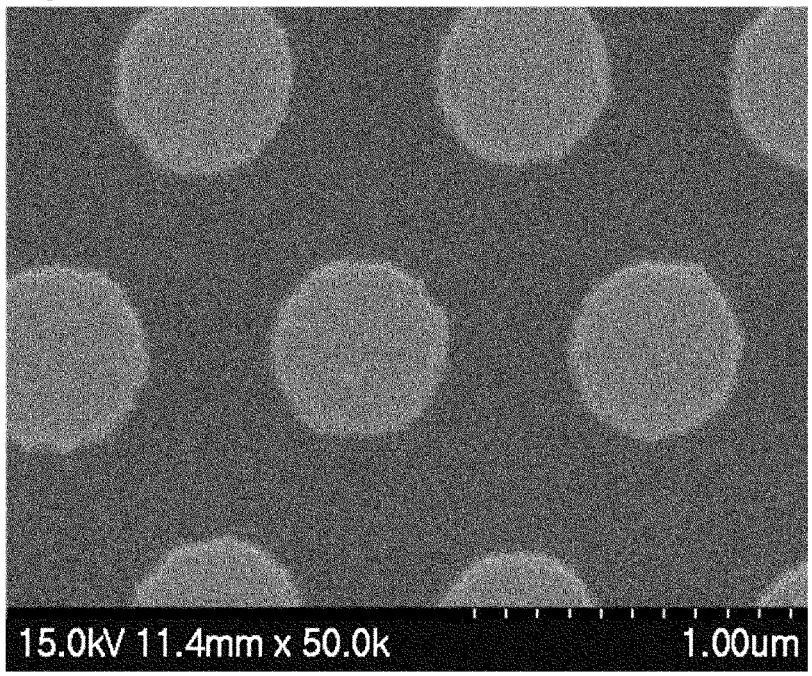
FIG. 24b is an electron microscope photograph showing a plane thereof.
Figure 25A:
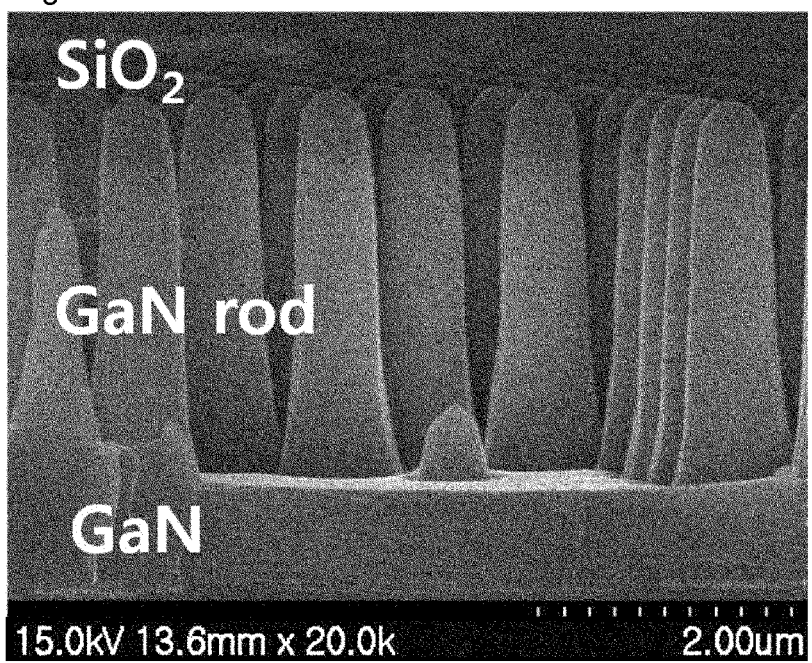
FIG. 25a is an electron microscope photograph showing a section of the present disclosure which has been etched under a $SiCl_4$ and Ar gas circumstance by means of inductively coupled plasma (ICP) by using the etched insulation layer.
Figure 25B:
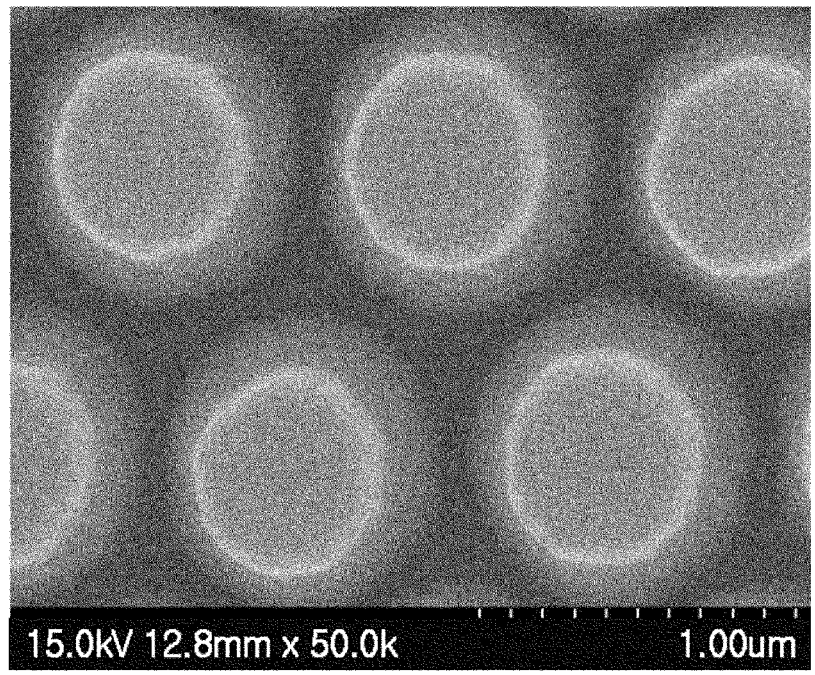
FIG. 25b is an electron microscope photograph showing a plane thereof.
Figure 26A:
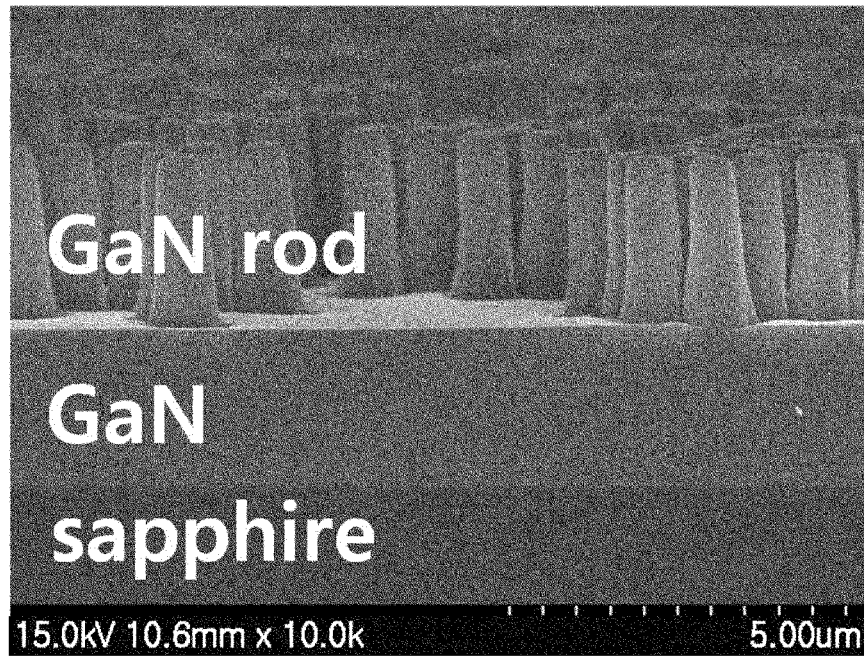
FIG. 26a is an electron microscope photograph showing a section of the present disclosure after the insulation layer used as a mask is removed.
Figure 26B:
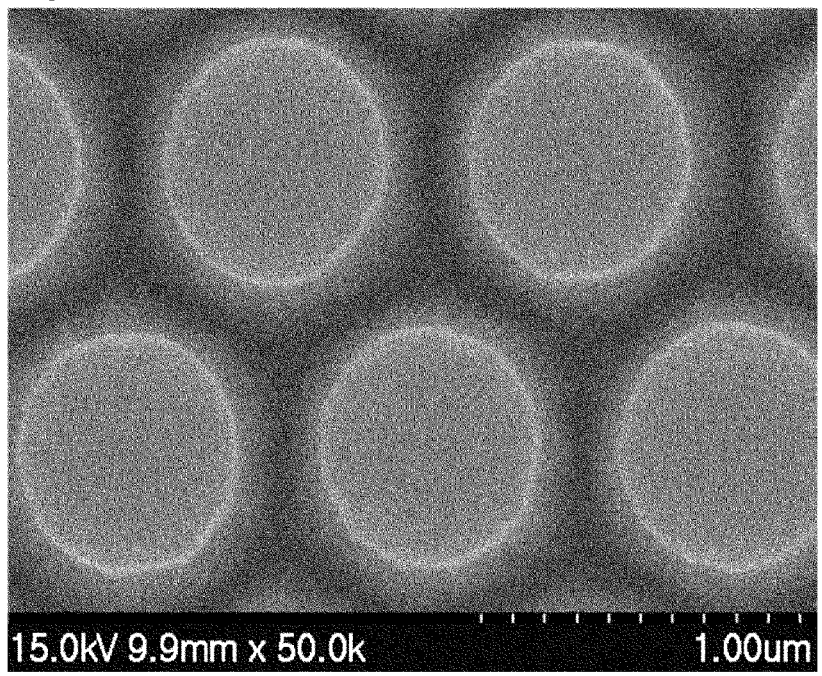
FIG. 26b is an electron microscope photograph showing a plane thereof.

By using the above LED basic element layer, a subminiature LED element was prepared according to the following process. First, $SiO_2$ (800 nm to 1 µm in thickness) serving as an insulation layer and a chrome layer (100 to 120 nm in thickness) serving as a metal mask layer were formed on the second conductive semiconductor layer by means of PECVD and thermal evaporation, respectively (PECVD: 60 W, 550 mtorr, $SiH_4$ 160 sccm, $N_2$ 240 sccm, $N_2O$ 1500 sccm, 35 to 40 minutes; thermal evaporation: 130 to 140 A, $9.0 \times 10^{-6}$ torr, 20 to 30 minutes) (see FIG. 19). Subsequently, a polystyrene nano-sphere was prepared as a monolayer (960 to 1000 nm in thickness) agreeably arranged in a hexagonal shape and formed on the metal mask layer (see FIGS. 20a and 20b). The monolayer was washed (50 W, 0.05 torr, $O_2$ 100 sccm) under an $O_2$ gas circumstance to have a reduced size of 500 to 800 nm (see FIGS. 21a and 21b). The polystyrene nano-sphere having a reduced size was used as a mask, and the metal mask layer was etched under a $Cl_2$ gas circumstance by means of RIE which is a dry etching method (50 W, 0.08 torr, $Cl_2$ 40 sccm) (see FIGS. 22a and 22b). By the etching process, a metal mask layer pattern transferred according to the shape of polystyrene was prepared (see FIGS. 23a and 23b), and by using the prepared metal mask layer pattern, the insulation layer region present at a lower portion was etched again under a $CF_4$ and $O_2$ gas circumstance (100 W, 0.042 torr, $CF_4$ 40 sccm, $O_2$ 2 sccm) (see FIGS. 24a and 24b). By using the insulation layer etched into a rod pattern, the semiconductor layer (GaN) was etched under a $SiCl_4$ and Ar gas circumstance by means of ICP (RF 50 W, ICP 300 W, 3 torr, $SiCl_4$ 2 sccm, Ar 20 sccm), thereby making a rod pattern of the semiconductor layer (see FIGS. 25a and 25b). Subsequently, the insulation layer used as a mask in order to make the rod pattern of the semiconductor layer was removed by etching under a $CF_4$ and $O_2$ gas circumstance (see FIGS. 26a and 26b).

Figure 27A:
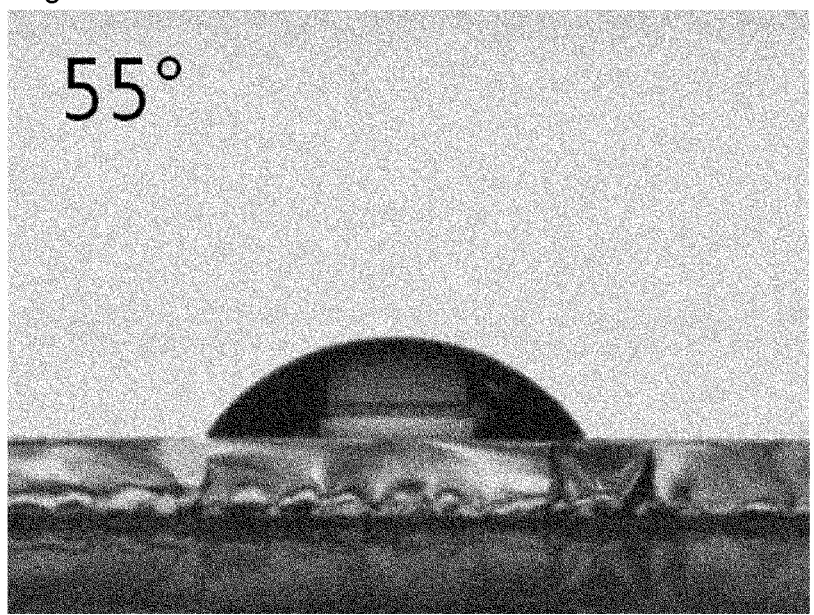
FIGS. 27a and 27b are diagrams showing contact angles measured before (27a) and after (27b) coating the semiconductor layer having an insulation coating ($Al_2O_3$) with a hydrophobic coating (octadecyltrichlorosilane (OTS)) according to the present disclosure.
Figure 27B:
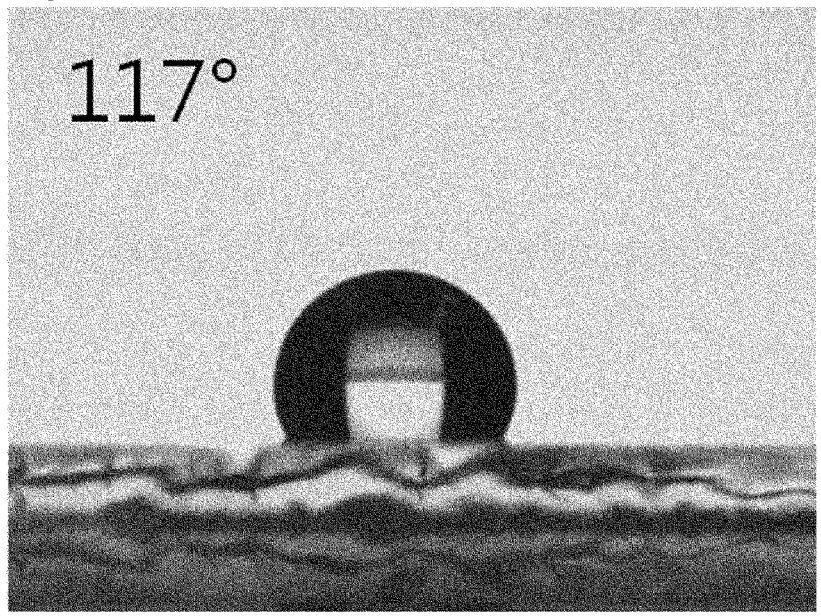
Figure 28A:
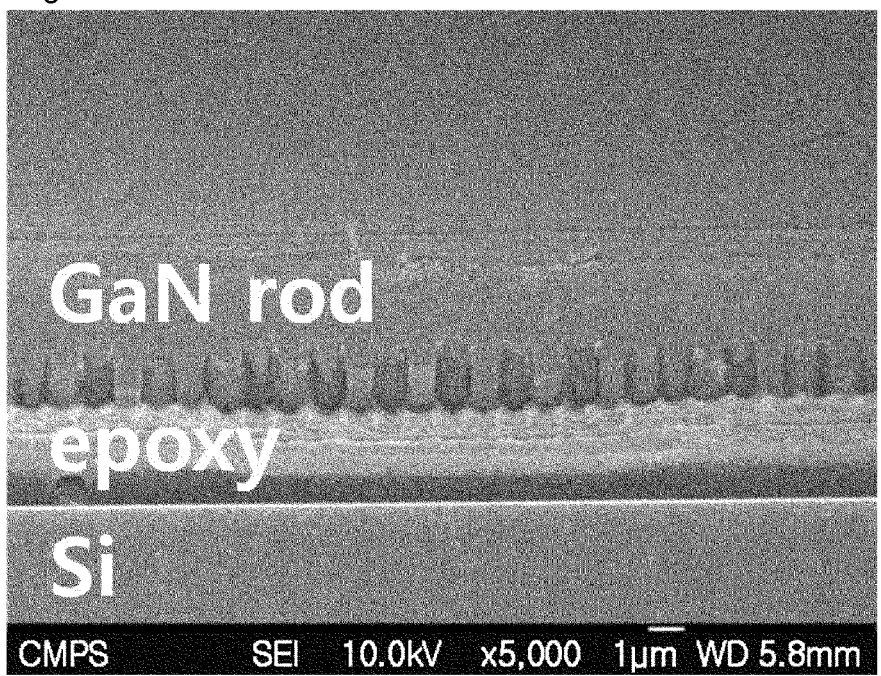
FIGS. 28a and 28b are electron microscope photographs showing a section of the present disclosure in which a lift-off process is performed toward a buffer layer to which a support film is not attached or toward an undoped semiconductor layer and a sapphire substrate.
Figure 28B:
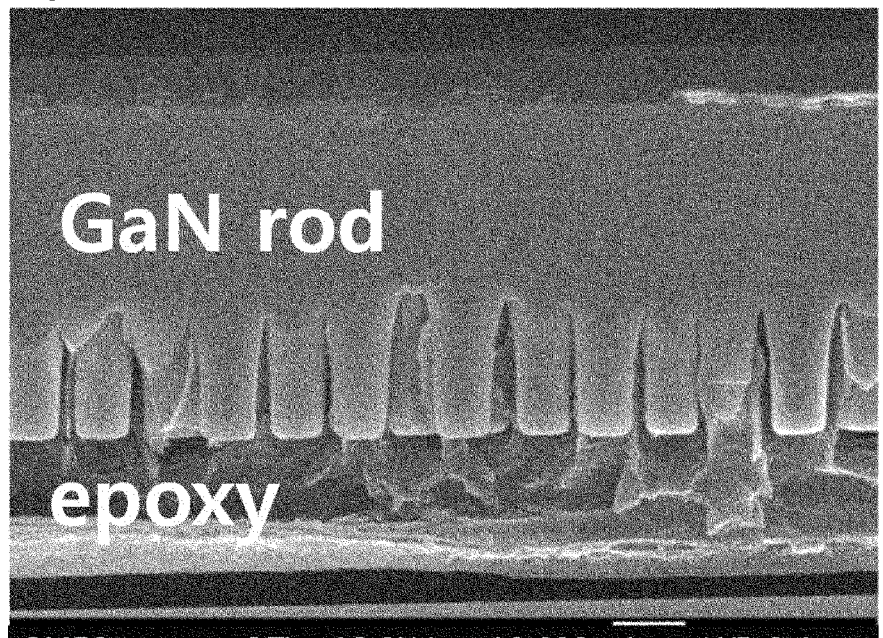
Figure 29A:
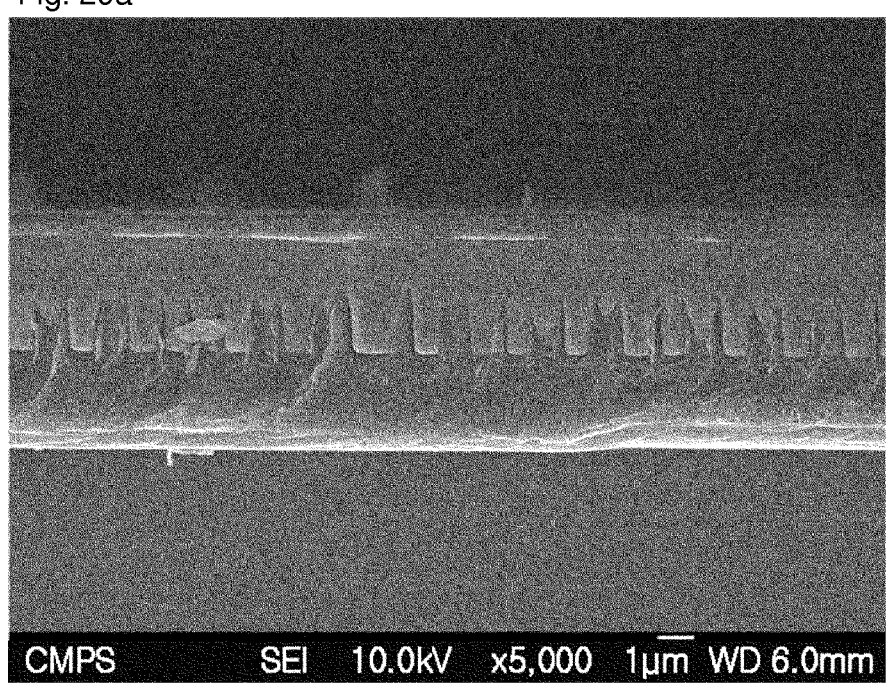
FIGS. 29a and 29b are electron microscope photographs showing a section of the present disclosure in which the buffer layer or the undoped semiconductor layer is further etched by means of ICP to expose the first conductive semiconductor layer.
Figure 29B:
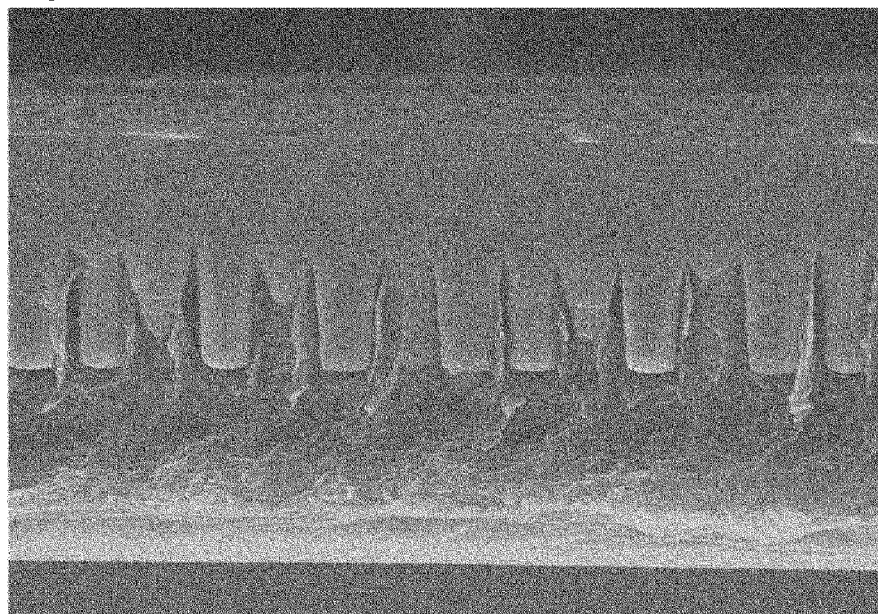
Figure 30A:
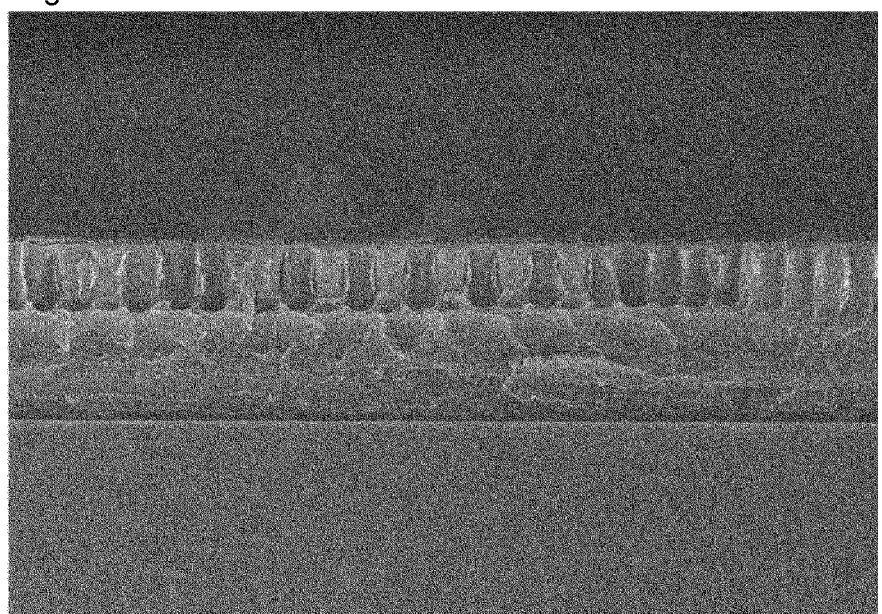
FIGS. 30a and 30b are electron microscope photographs showing a section of the present disclosure in which etching is further performed by means of ICP.
Figure 30B:
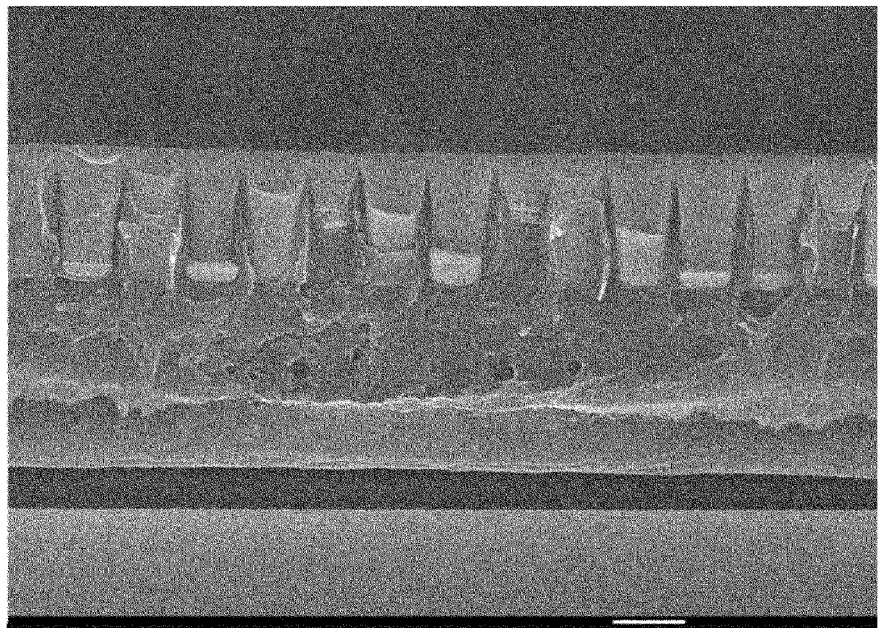
Figure 31A:
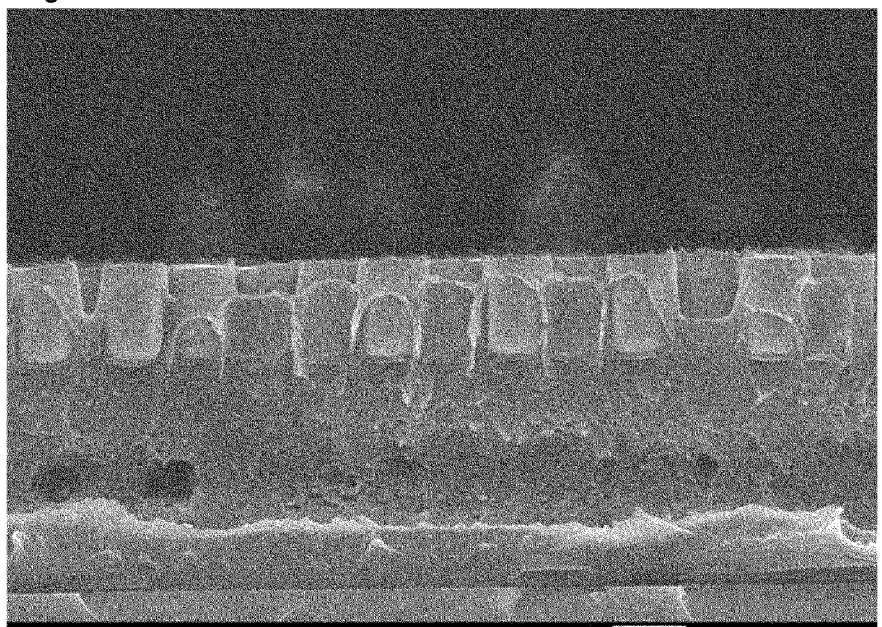
FIG. 31a is an electron microscope photograph showing a section of the present disclosure in which etching is performed by means of ICP to expose the first conductive semiconductor layer.
Figure 31B:
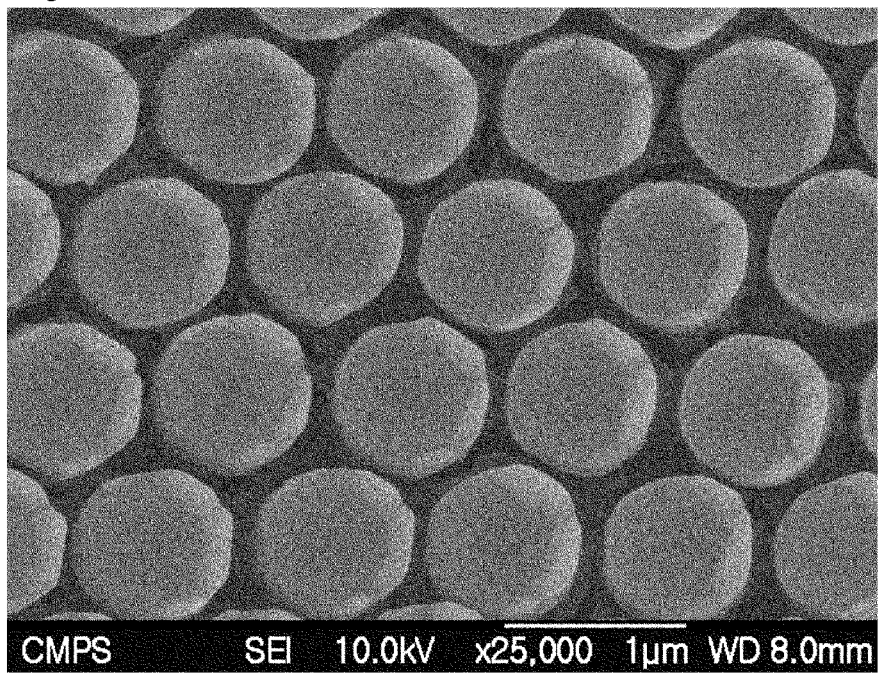
FIG. 31b is an electron microscope photograph showing a plane thereof.

The outer circumference of the semiconductor layer prepared as above was coated with an insulation coating ($Al_2O_3$) by means of atomic layer deposition (ALD) (trimethylaluminum (TMA) was used as a metal reactant material, steam was used as an oxygen source, TMA vapor pressure was 0.04 torr, a chamber temperature was maintained to be 80° C., Ar was used as a carrier gas and a purging gas, and a growth rate was ~1.5 Å) (thickness: 20 nm), and was also coated with octadecyltrichlorosilane (OTS) as a hydrophobic coating by means of a self-assembling process to have a thickness of several nanometers. Referring to FIGS. 27a and 27b, it may be found that a contact angle with water increases due to the hydrophobic coating. After the insulation coating and the hydrophobic coating are formed, a support film was attached onto the second electrode layer by using an epoxy resin (cyanoacrylate adhesive metal-type, purchased from Sigma Aldrich) (thickness: 3.5 to 5 µm). Subsequently, a lift-off process using laser was performed toward the buffer layer to which a support film is not formed, or the undoped semiconductor layer and the sapphire substrate to remove the sapphire substrate (see FIGS. 28a and 28b). In order to expose the first conductive semiconductor layer, the buffer layer or the undoped semiconductor layer was removed by etching by means of ICP under a $SiCl_4$ and Ar gas circumstance (RF 50 W, ICP 300 W, 3 torr, $SiCl_4$ 2 sccm, Ar 20 sccm). By doing so, an independent subminiature LED rod pattern to which the support film was attached may be obtained (see FIGS. 29a and 29b, FIGS. 30a and 30b, and FIGS. 31a and 31b).

Figure 32:
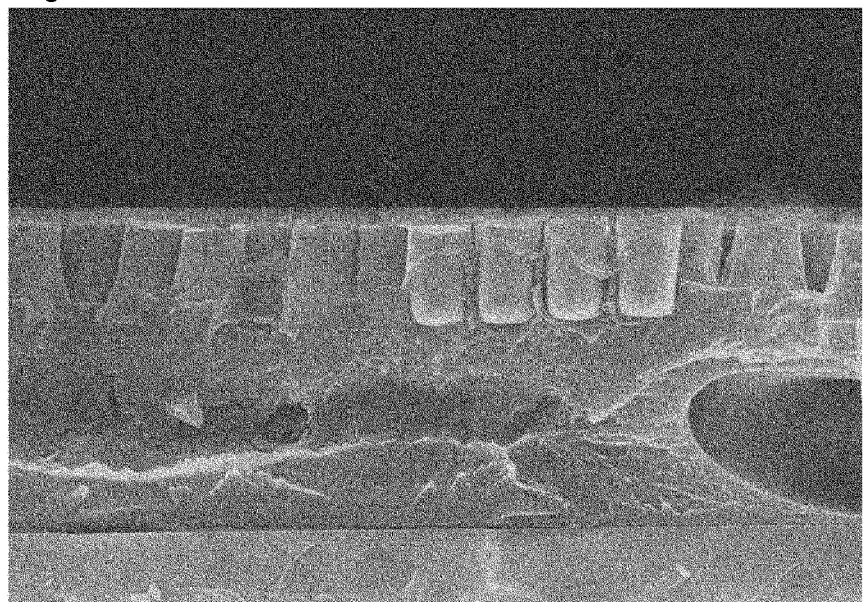
FIG. 32 is an electron microscope photograph showing a section of the present disclosure in which an electrode (Ti) is deposited to the first conductive semiconductor layer of the subminiature LED by means of sputtering.
Figure 33:
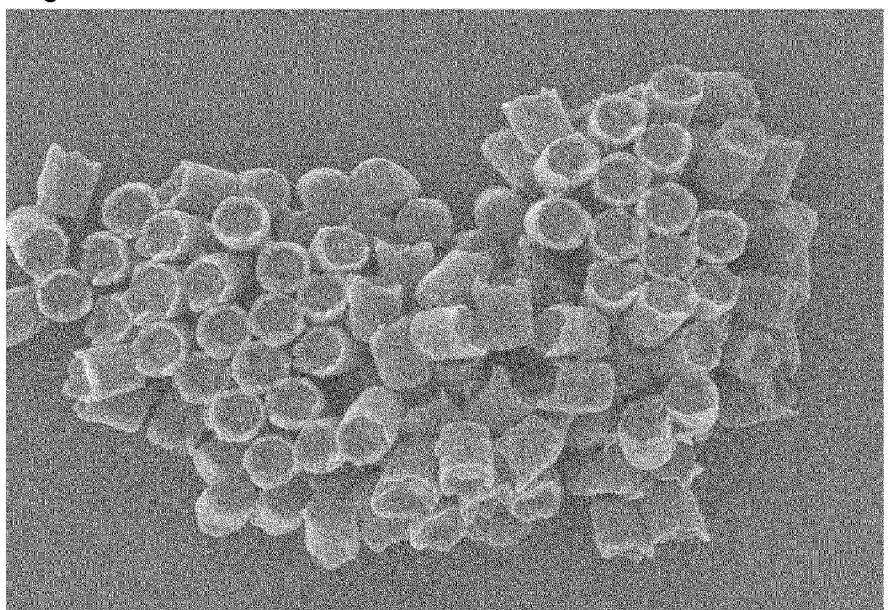
FIG. 33 is an electron microscope photograph showing a subminiature LED in an independent state after removing the support film with acetone according to the present disclosure.
Figure 34:
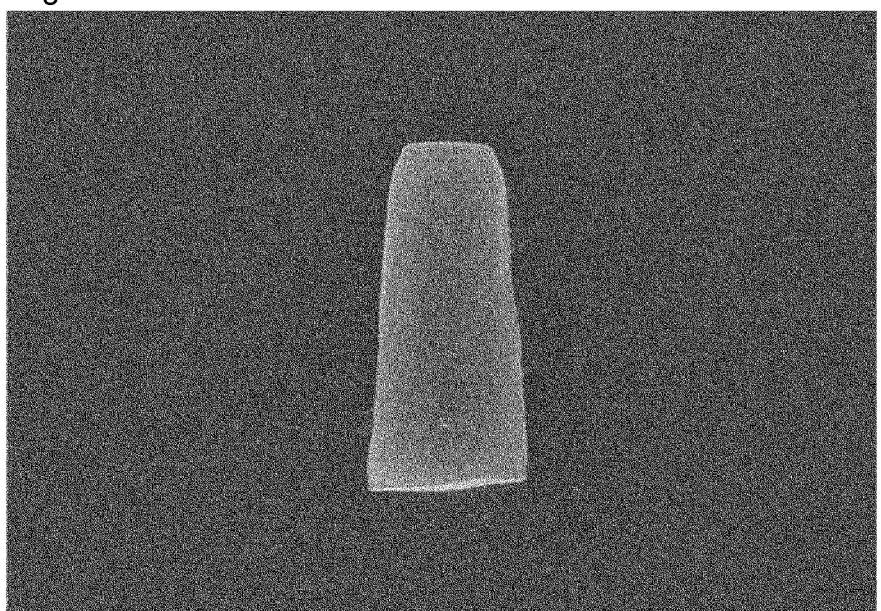
FIG. 34 is an electron microscope photograph showing a single independent subminiature LED of FIG. 33.
Figure 35:
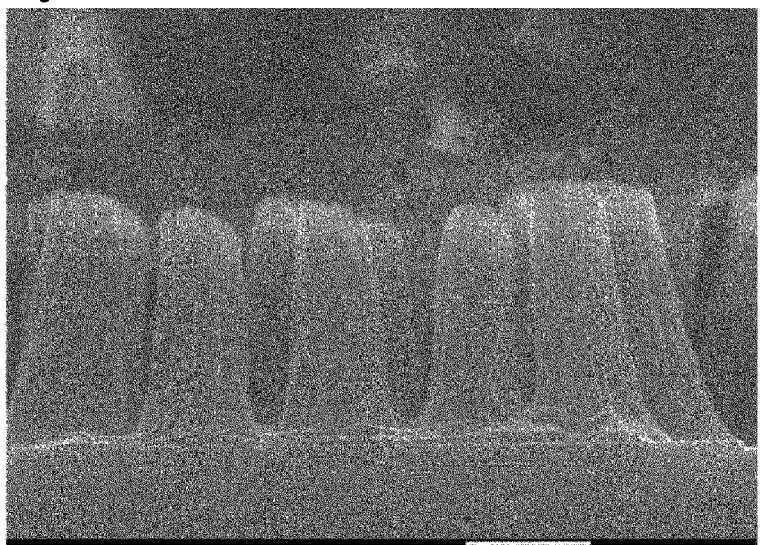
FIG. 35 is an electron microscope photograph showing that independent subminiature LED elements of FIG. 33 are arranged on an electrode substrate.
Figure 36:
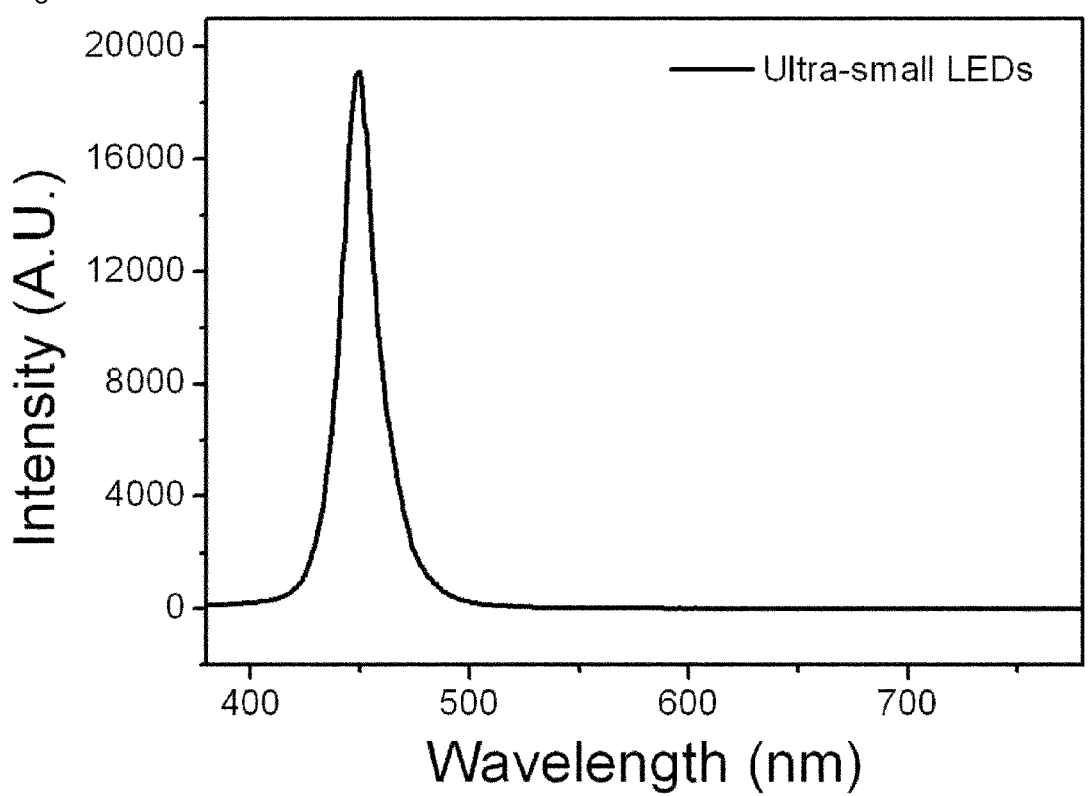
FIG. 36 shows a spectrum measured after the subminiature LED elements of the present disclosure are arranged on the electrode substrate.
Figure 37A:
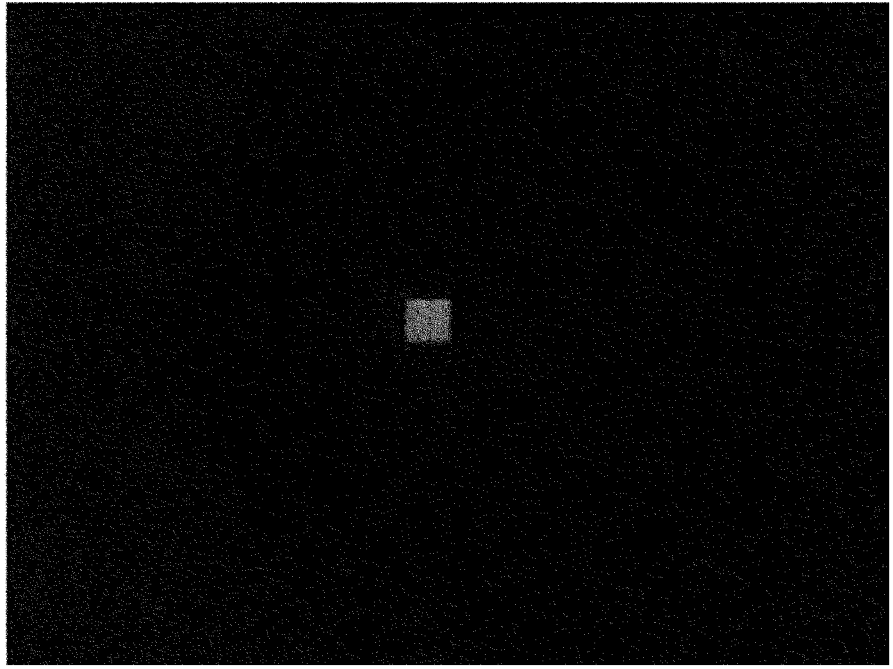
FIGS. 37a to 37c are photographs observed by naked eyes, showing that the subminiature LED of the present disclosure emits light in blue.
Figure 37B:
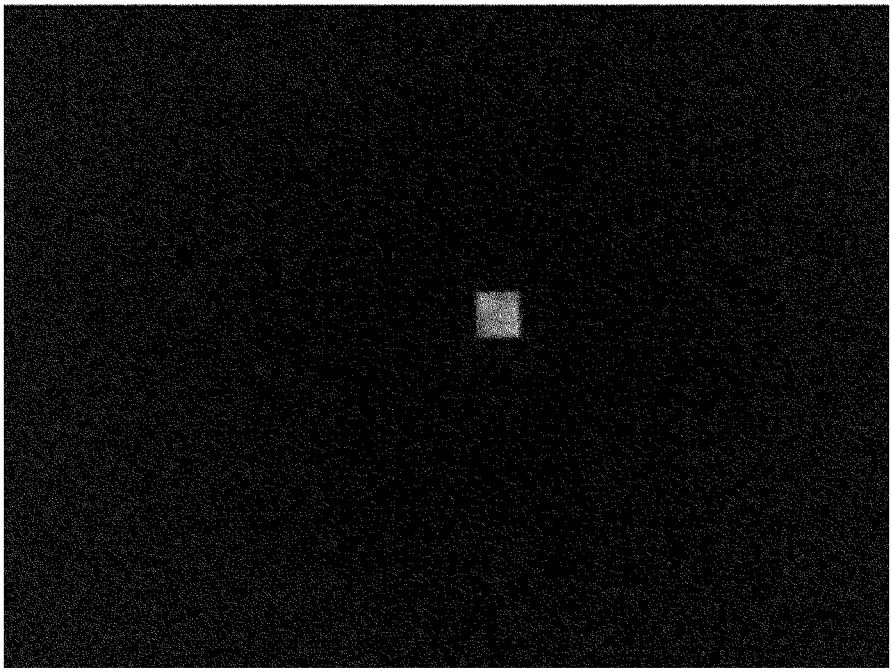
Figure 37C:
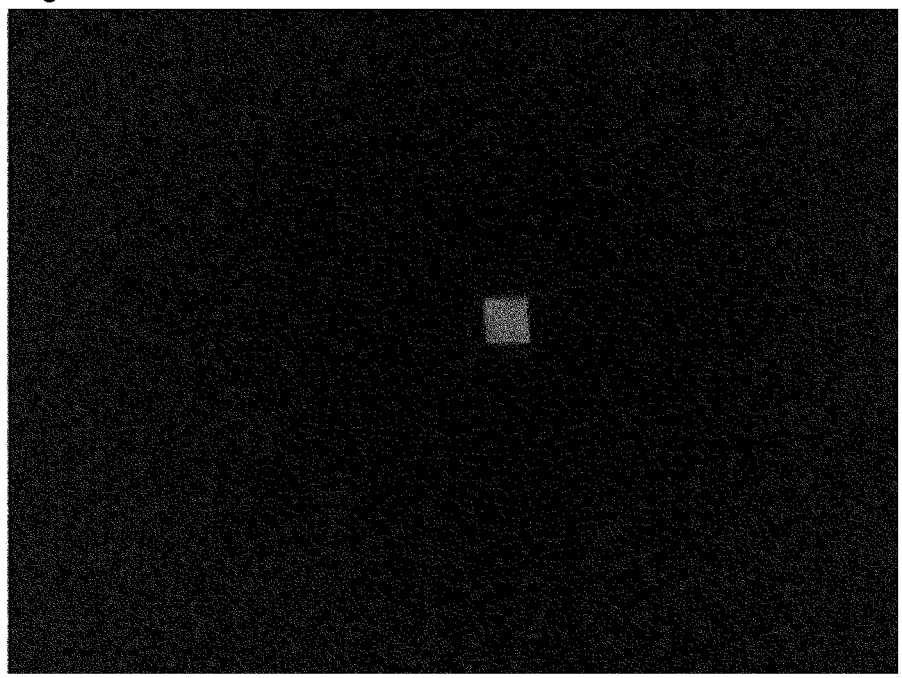

Subsequently, a Ti electrode was deposited to the first conductive semiconductor layer of the subminiature LED by using a sputtering device (DC-sputtering system) (300V, 0.17 A, Ar 100 sccm) (see FIG. 32). Next, the electrode surface was coated with dithiol as a coupling linker by means of liquid or vapor self-assembling. The coating process was performed in a liquid state. In addition, 1 mM of nonamedithiol solution was prepared by mixing ethanol anhydride (10 ml) and nonamedithiol (20 µl), and the subminiature LED rod shape to which the electrode was deposited was dipped in the nonamedithiol solution for a day and then taken out and washed. The support film was removed by using acetone so that independent subminiature LEDs are prepared in an ink or paste form (see FIGS. 33 and 34). The ink or paste form was arranged by being dropped onto an electrode substrate having a linker (metal micro powder: silver nanoparticles) which reacts with the coupling linker. In regard of the electrode substrate, a pattern was formed by using a dithiol linker reacting with the electrode substrate and silver nanoparticles serving as the metal micro powder capable of reacting with the coupling linker of the subminiature LED. In detail, the nonamedithiol linker was firstly attached to the electrode substrate by reaction, and an opposite side of the nonamedithiol linker not attached to the electrode substrate was coated with silver nanoparticles. The coating process was performed by putting the electrode substrate attached to the nonamedithiol linker into a toluene solution in which silver nanoparticles are dispersed, and then taking out the same after reaction. By doing so, the metal micro powder of the electrode substrate was reacted with the coupling linker of the subminiature LED, and then a metallic ohmic layer was formed through a soldering process (annealing at 100 to 200° C.), thereby manufacturing the subminiature LED element according to the present disclosure (see FIG. 35). Meanwhile, FIG. 36 shows a spectrum measured after the subminiature LED elements prepared as above are arranged on the electrode substrate, and FIGS. 37a to 37c are photographs observed by naked eyes, showing that the manufactured subminiature LED elements. As shown in these figures, it may be found that a blue light is emitted from the subminiature LED element according to the present disclosure.

The subminiature LED element according the present disclosure may be widely utilized over the entire display industries.

The invention claimed is:

1. A manufacturing method of a subminiature LED element, the method comprising:
   (a) forming a first conductive semiconductor layer, an active layer and a second conductive semiconductor layer in order on a substrate;
   (b) etching the first conductive semiconductor layer, the active layer and the second conductive semiconductor layer so that the LED element has a diameter of a nanometer or micrometer level; and
   (c) forming an insulation film on the outer circumference of the first conductive semiconductor layer, the active layer and the second conductive semiconductor layer, coating an upper portion of the insulation film with a hydrophobic film, and removing the substrate.

2. The manufacturing method of a subminiature LED element according to claim 1, wherein the first conductive semiconductor layer includes at least one n-type semiconductor layer, and the second conductive semiconductor layer includes at least one p-type semiconductor layer.

3. The manufacturing method of a subminiature LED element according to claim 1, wherein the step (b) includes:
   (i) forming a second electrode layer, an insulation layer and a metal mask layer in order on the second conductive semiconductor layer;
   (ii) forming a polymer layer on the metal mask layer and patterning the polymer layer with nanometer or micrometer intervals;
   (iii) dry-etching or wet-etching the first conductive semiconductor layer, the active layer and the second conductive semiconductor layer according to the pattern with nanometer or micrometer intervals; and
   (iv) removing the insulation layer, the metal mask layer and the polymer layer.

4. The manufacturing method of a subminiature LED element according to claim 1, wherein the step (b) includes:
   (i) forming a second electrode layer, an insulation layer and a metal mask layer on the second conductive semiconductor layer;
   (ii) forming a nanosphere or microsphere monolayer on the metal mask layer and performing self-assembling;
   (iii) dry-etching or wet-etching the first conductive semiconductor layer, the active layer and the second conductive semiconductor layer according to the pattern with nanometer or micrometer intervals; and
   (iv) removing the insulation layer, the metal mask layer and the monolayer.

5. The manufacturing method of a subminiature LED element according to claim 4, wherein the nanosphere or microsphere is made of polystyrene.

6. The manufacturing method of a subminiature LED element according to claim 3, wherein the step (c) further includes:
   (i) forming a support film on the second electrode layer;
   (ii) the forming of the insulation film on the outer circumference including the first conductive semiconductor layer, the active layer and the second conductive semiconductor layer;
   (iii) the coating of the upper portion of the insulation film with the hydrophobic film;
   (iv) the removing of the substrate;
   (v) forming a first electrode layer at the lower portion of the first conductive semiconductor layer; and
   (vi) removing the support film to manufacture a plurality of subminiature LED elements.

7. The manufacturing method of a subminiature LED element according to claim 3, wherein the step (c) further includes:
   (i) forming a support film on the second electrode layer;
   (ii) the forming of the insulation film on the outer circumference including the first conductive semiconductor layer, the active layer and the second conductive semiconductor layer;
   (iii) the coating of the upper portion of the insulation film with the hydrophobic film;
   (iv) the removing of the substrate;
   (v) forming a first electrode layer at the lower portion of the first conductive semiconductor layer;
   (vi) forming a coupling linker on at least one surface of the first electrode layer and the second electrode layer; and
   (vii) removing the support film to manufacture a plurality of subminiature LED elements.

8. A subminiature LED element, comprising:
   a first conductive semiconductor layer;
   an active layer formed on the first conductive semiconductor layer; and
   a semiconductor light emission element of a micrometer or nanometer size including a second conductive semiconductor layer formed on the active layer,
   wherein the outer circumference of the semiconductor light emission element is coated with an insulation film, and
   wherein an upper portion of the insulation film is coated with a hydrophobic film.

9. The subminiature LED element according to claim 8, wherein a first electrode layer is formed at the lower portion of the first conductive semiconductor layer, and a second electrode layer is formed at the upper portion of the second conductive semiconductor layer.

10. The subminiature LED element according to claim 8, wherein a coupling linker for self-assembling is provided to at least one of the lower surface of the first electrode layer and the upper surface of the second electrode layer.

11. The subminiature LED element according to claim 10, wherein the coupling linker is complementarily coupled to a substrate of an LED display.

12. The subminiature LED element according to claim 8, wherein the first conductive semiconductor layer includes at least one n-type semiconductor layer, and the second conductive semiconductor layer includes at least one p-type semiconductor layer.

13. The subminiature LED element according to claim 8, wherein the insulation film includes at least one selected from the group consisting of $SiO_2$, $Si_3N_4$, $Al_2O_3$ and $TiO_2$, the hydrophobic film includes at least one of SAMs and fluorine polymer, and the coupling linker includes a thiol group.

* * * * *